(12) United States Patent
Lee et al.

(10) Patent No.: US 12,494,426 B2
(45) Date of Patent: Dec. 9, 2025

(54) TRANSISTOR CAPABLE OF ELECTRICALLY CONTROLLING A THRESHOLD VOLTAGE AND SEMICONDUCTOR DEVICE INCLUDING THE TRANSISTOR

(71) Applicant: SAMSUNG ELECTRONICS CO., LTD., Suwon-si (KR)

(72) Inventors: Seonhaeng Lee, Hwaseong-si (KR); Gangjun Kim, Gunpo-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 623 days.

(21) Appl. No.: 17/748,291

(22) Filed: May 19, 2022

(65) Prior Publication Data
US 2023/0101075 A1    Mar. 30, 2023

(30) Foreign Application Priority Data
Sep. 13, 2021  (KR) .................. 10-2021-0121561

(51) Int. Cl.
  *H01L 23/525*   (2006.01)
  *H01L 21/28*    (2025.01)
  (Continued)

(52) U.S. Cl.
  CPC ...... *H01L 23/5252* (2013.01); *H01L 23/5283* (2013.01); *H10D 64/021* (2025.01); *H10D 64/037* (2025.01); *H01L 21/76224* (2013.01)

(58) Field of Classification Search
  CPC ......... H01L 29/40117; H01L 29/42324; H01L 29/42328; H01L 29/66833; H01L 29/4234
  See application file for complete search history.

(56) References Cited

U.S. PATENT DOCUMENTS 6,888,398 B2   5/2005   Koehl et al.
7,018,935 B2   3/2006   Park
(Continued)

FOREIGN PATENT DOCUMENTS

KR       10-507702         8/2005
KR    10-2012-0006707      1/2012
(Continued)

OTHER PUBLICATIONS

Office Action dated Jun. 22, 2025 issued in corresponding Korean Patent Application No. 10-2021-0121561.

*Primary Examiner* — Kretelia Graham
*Assistant Examiner* — David J Goodwin
(74) *Attorney, Agent, or Firm* — MORGAN, LEWIS & BOCKIUS LLP

(57) ABSTRACT

A transistor includes: a gate structure disposed on a substrate, and including a gate insulation layer and a gate electrode; a first impurity region disposed at an upper portion of a substrate and adjacent to a first sidewall of the gate structure; a second impurity region disposed at an upper portion of the substrate and adjacent to a second sidewall opposite to the first sidewall of the gate structure; and a first threshold voltage controlling line spaced apart from the substrate, wherein the first threshold voltage controlling line faces at least a portion of the first impurity region, wherein the first threshold voltage controlling line includes a conductive material, and wherein the first threshold voltage controlling line extends in a direction that crosses a direction in which the first impurity region extends.

20 Claims, 22 Drawing Sheets

(51) Int. Cl.
  *H01L 23/528*   (2006.01)
  *H01L 29/66*    (2006.01)
  *H10D 64/01*    (2025.01)
  *H01L 21/762*   (2006.01)

(56) References Cited

U.S. PATENT DOCUMENTS

| | | | |
|---|---|---|---|
| 8,878,291 | B2 | 11/2014 | Jung |
| 9,123,724 | B2 | 9/2015 | Tong et al. |
| 9,953,990 | B1 | 4/2018 | Horch et al. |
| 10,347,646 | B2 | 7/2019 | Liaw et al. |
| 10,916,648 | B2 | 2/2021 | Kim et al. |
| 2006/0258090 | A1* | 11/2006 | Bhattacharyya ...... H01L 29/513 438/257 |
| 2008/0179656 | A1* | 7/2008 | Aoki ...................... H10B 41/30 257/E21.294 |
| 2012/0012943 | A1 | 1/2012 | Jung |
| 2016/0197091 | A1* | 7/2016 | Hisamoto ......... H01L 29/42344 257/326 |
| 2018/0331116 | A1* | 11/2018 | Tezuka ..................... G11C 7/18 |

FOREIGN PATENT DOCUMENTS

| | | |
|---|---|---|
| KR | 10-1950002 | 2/2019 |
| KR | 10-2019-0142881 A | 12/2019 |

\* cited by examiner

TRANSISTOR CAPABLE OF ELECTRICALLY CONTROLLING A THRESHOLD VOLTAGE AND SEMICONDUCTOR DEVICE INCLUDING THE TRANSISTOR

CROSS-REFERENCE TO RELATED APPLICATION

This application claims priority under 35 U.S.C. § 119 to Korean Patent Application No. 10-2021-0121561, filed on Sep. 13, 2021, in the Korean Intellectual Property Office (KIPO), the disclosure of which is incorporated by reference herein in its entirety.

TECHNICAL FIELD

Example embodiments of the present inventive concept relate to a transistor and a semiconductor device including the transistor. More particularly, example embodiments of the present inventive concept relate to a transistor capable of electrically controlling a threshold voltage and the semiconductor device including the transistor.

DISCUSSION OF THE RELATED ART

Typically, a repair circuit or a memory cell of a semiconductor device may include at least one transistor. For example, the repair circuit in a semiconductor device may include an anti-fuse cell including two transistors. Generally, the anti-fuse cell may include a rupture transistor that may be programmed through a breakdown of a gate insulation layer of the rupture transistor. However, the rupture transistor cannot restore electrical characteristics after the breakdown of the gate insulation layer. In addition, generally, the memory cell including the at least one transistor may be for reading and writing data.

SUMMARY

According to an example embodiment of the present inventive concept, a transistor includes: a gate structure disposed on a substrate, and including a gate insulation layer and a gate electrode, wherein and the gate structure extends in a first direction; a first impurity region disposed at an upper portion of a substrate and adjacent to a first sidewall of the gate structure; a second impurity region disposed at an upper portion of the substrate and adjacent to a second sidewall opposite to the first sidewall of the gate structure; and a first threshold voltage controlling line spaced apart from the substrate, wherein the first threshold voltage controlling line faces at least a portion of the first impurity region, wherein the first threshold voltage controlling line includes a conductive material, and wherein the first threshold voltage controlling line extends in a direction that crosses the first direction.

According to an example embodiment of the present inventive concept, a semiconductor device includes: a substrate including an active region and an isolation region; a gate structure disposed on the substrate, and including a gate insulation layer and a gate electrode, wherein the gate structure extends across the active region; a first impurity region disposed at an upper portion of the active region and adjacent to a first sidewall of the gate structure; a second impurity region disposed at an upper portion of the active region and adjacent to a second sidewall opposite to the first sidewall of the gate structure; a first contact plug contacting the first impurity region; a first conductive line contacting the first contact plug; a second contact plug contacting the second impurity region; a second conductive line contacting the second contact plug; a third contact plug contacting the gate electrode; a third conductive line contacting the third contact plug; and a first threshold voltage controlling line spaced apart from the substrate, wherein the first threshold voltage controlling line faces at least a portion of the first impurity region, wherein the first threshold voltage controlling line includes a conductive material, and wherein a depletion region is generated at the first impurity region, when a voltage is applied to the first threshold voltage controlling line.

According to an example embodiment of the present inventive concept, a semiconductor device includes: a substrate including an active region and an isolation region; a gate structure disposed on the substrate, and including a gate insulation layer and a gate electrode, wherein the gate structure extends in a first direction to across the active region; a charge trap spacer configured to store charges and disposed on a first sidewall of the gate structure; a first impurity region disposed adjacent to the first sidewall of the gate structure; a second impurity region disposed adjacent to a second sidewall opposite to the first sidewall of the gate structure; and a first threshold voltage controlling line spaced apart from the substrate, wherein the first threshold voltage controlling line faces at least a portion of the first impurity region, wherein the first threshold voltage controlling line includes a conductive material, and wherein the first threshold voltage controlling line extends in the first direction, wherein charges are trapped or detrapped at the charge trap spacer, when a voltage is applied to the first threshold voltage controlling line.

BRIEF DESCRIPTION OF THE DRAWINGS

The above and other features of the present inventive concept will become more apparent by describing in detail example embodiments thereof, with reference to the accompanying drawings, in which.

DETAILED DESCRIPTION OF THE EMBODIMENTS

Hereinafter, example embodiments of the present inventive concept will be described in detail with reference to the accompanying drawings.

Figure 1:
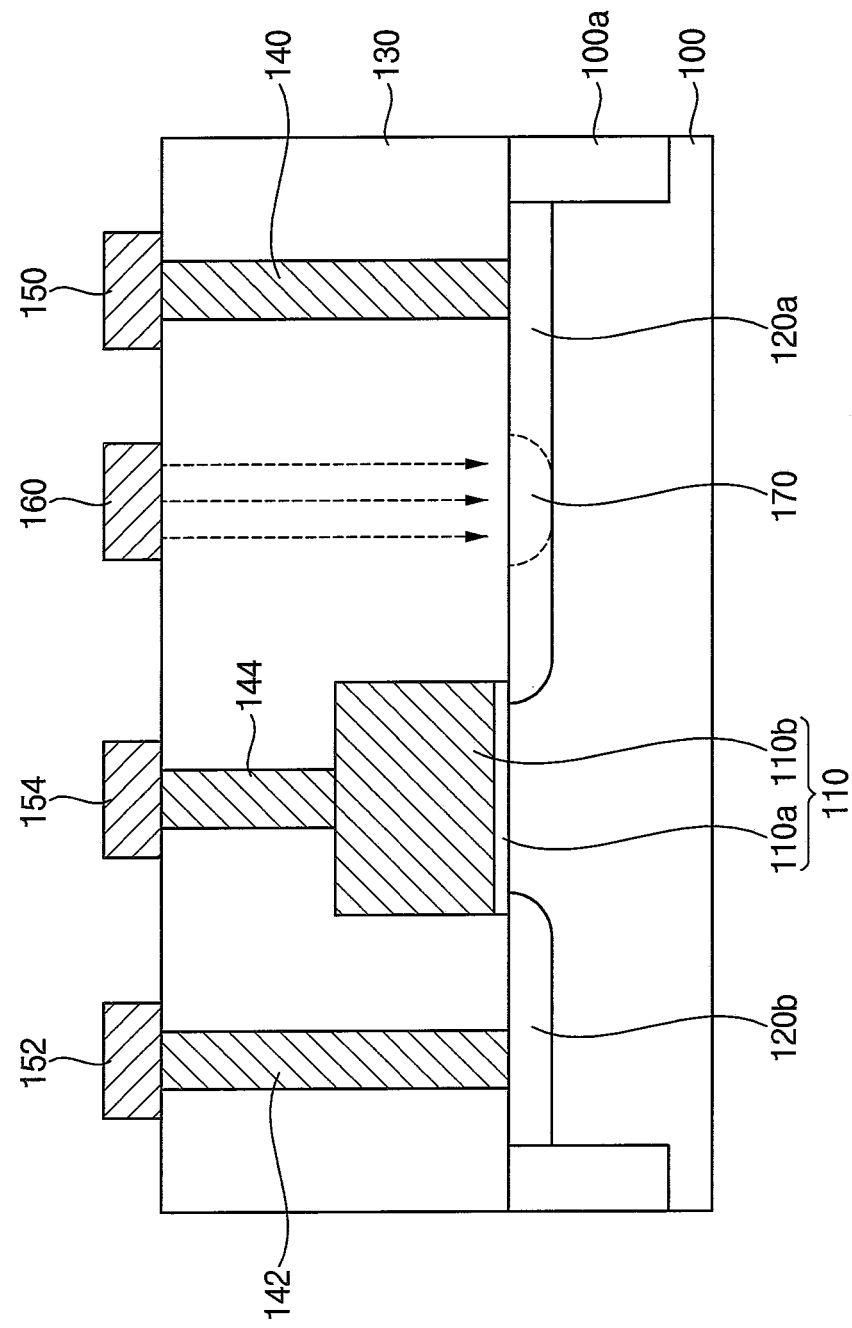
FIGS. 1 and 2 are respectively a cross-sectional view and a perspective view illustrating a transistor capable of controlling a threshold voltage in accordance with an example embodiment of the present inventive concept.
Figure 2:
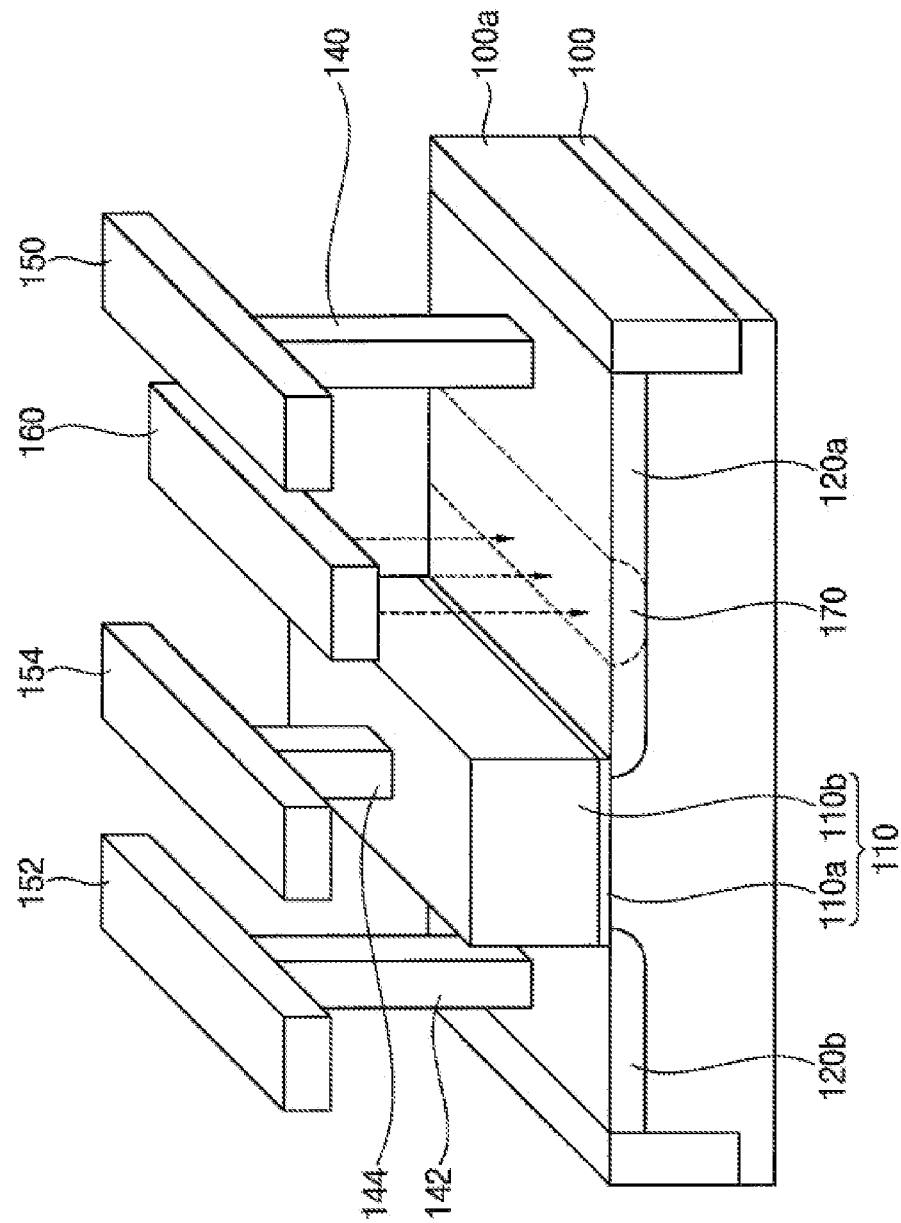
Figure 3:
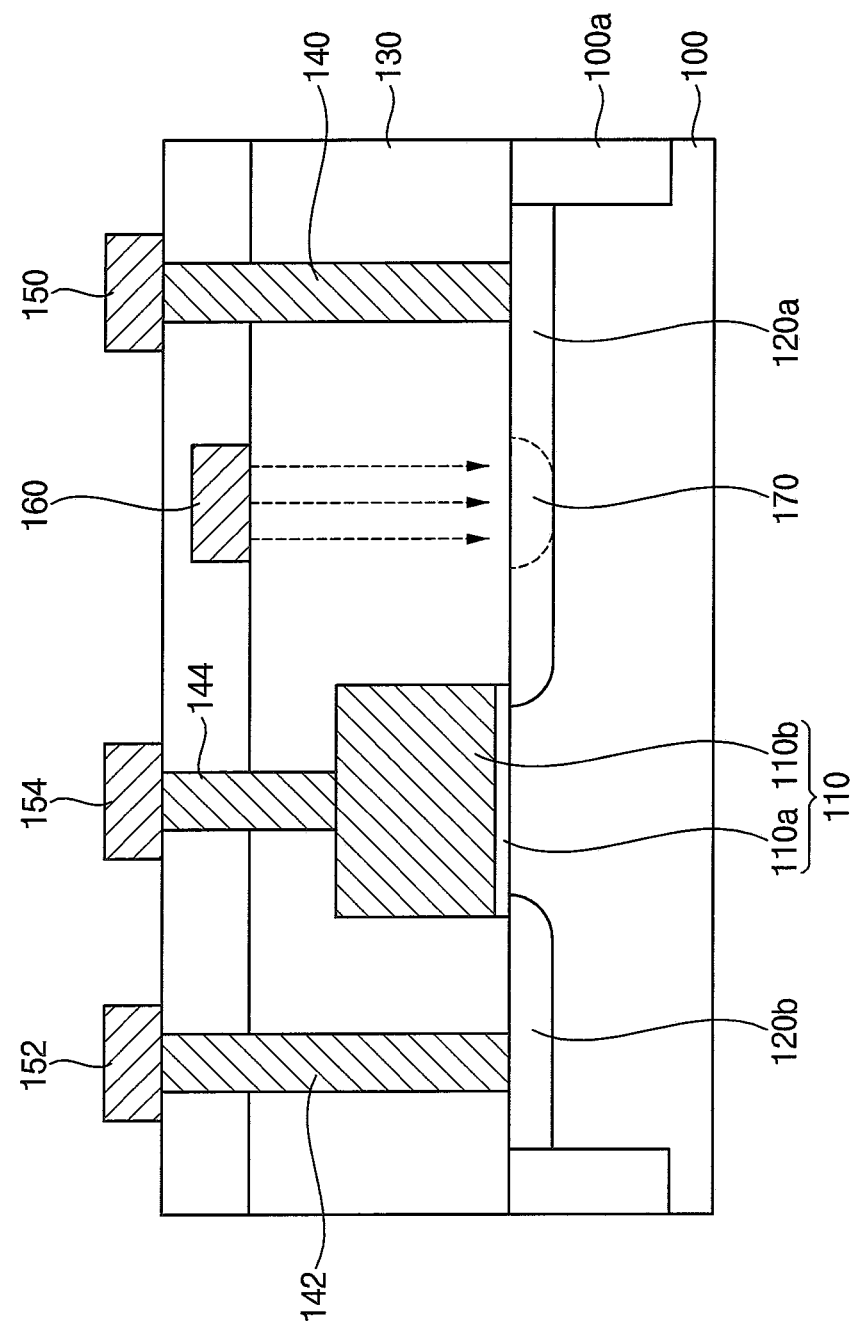
FIG. 3 is a cross-sectional view illustrating a transistor capable of controlling a threshold voltage in accordance with an example embodiment of the present inventive concept.
Figure 4:
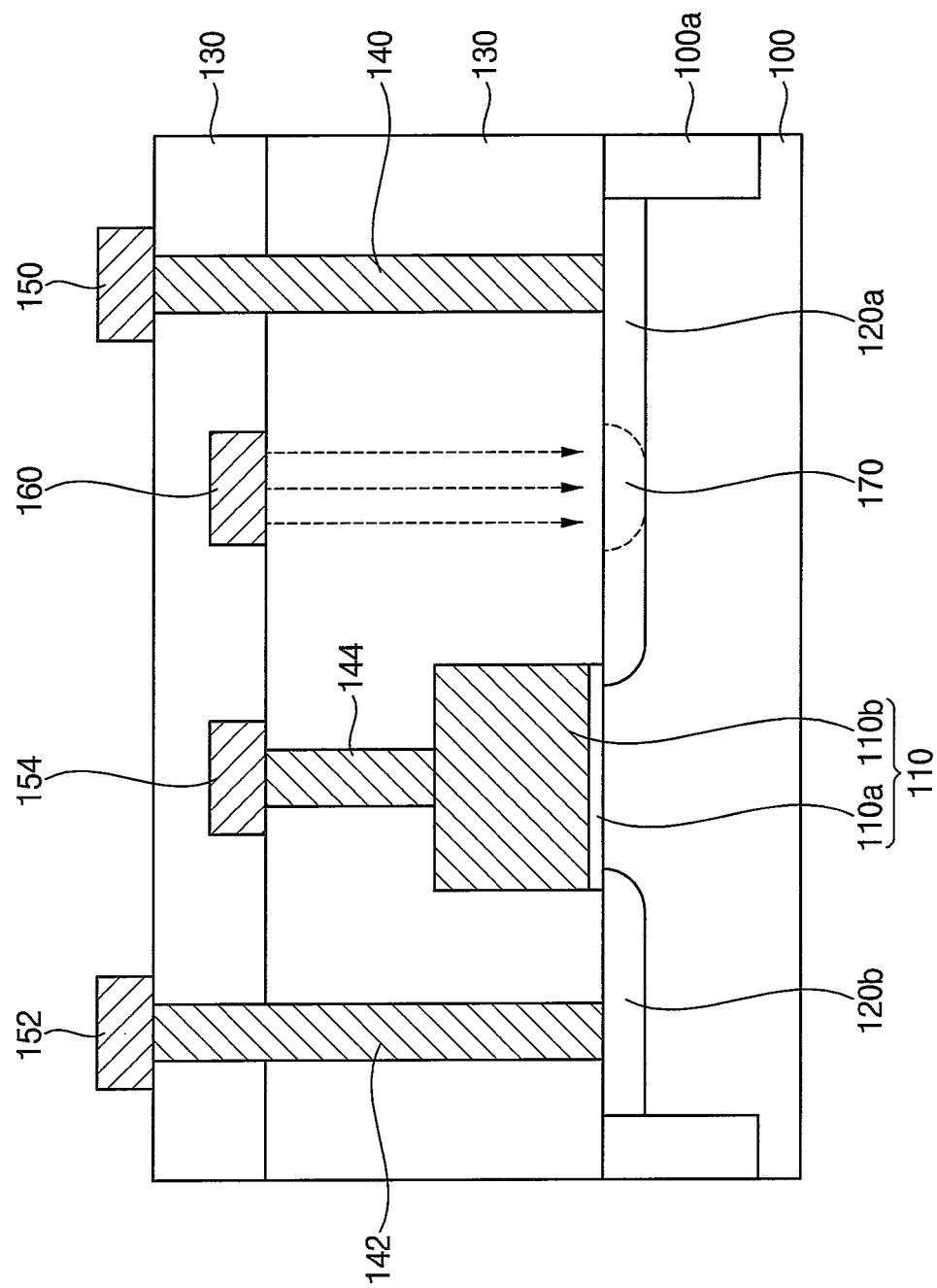
FIG. 4 is a cross-sectional view illustrating a transistor capable of controlling a threshold voltage in accordance with an example embodiment of the present inventive concept.

FIGS. 1 and 2 are respectively a cross-sectional view and a perspective view illustrating a transistor capable of controlling a threshold voltage in accordance with an example embodiment of the present inventive concept. FIG. 3 is a cross-sectional view illustrating a transistor capable of controlling a threshold voltage in accordance with an example embodiment of the present inventive concept. FIG. 4 is a cross-sectional view illustrating a transistor capable of controlling a threshold voltage in accordance with an example embodiment of the present inventive concept.

Referring to FIGS. 1 and 2, the transistor may be formed on a substrate 100. The transistor may include a gate structure 110, a first impurity region 120*a*, a second impurity region 120*b*, a first contact plug 140, a second contact plug 142, a third contact plug 144, a first conductive line 150, a second conductive line 152, a third conductive line 154, and a threshold voltage controlling line 160. Further, an insulating interlayer 130 may be formed on the substrate 100.

The substrate 100 may be divided into an active region and an isolation region 100*a*. The active region may be disposed between isolation regions 100*a*.

The gate structure 110 may include a gate insulation layer 110*a* and a gate electrode 110*b* stacked on each other. The gate structure 110 may extend to cross the active region. The gate structure 110 may extend in a first direction parallel to an upper surface of the substrate 100.

In an example embodiment of the present inventive concept, a capping layer pattern may be formed on the gate electrode 110*b*. In an example embodiment of the present inventive concept, a spacer may be formed on sidewalls of the gate structure 110.

The first impurity region 120*a* may be positioned at an upper portion of the substrate 100 adjacent to a first sidewall of the gate structure 110. The second impurity region 120*b* may be positioned at the upper portion of the substrate 100 adjacent to a second sidewall of the gate structure 110. The portion of the substrate 100 between the first and second impurity regions 120*a* and 120*b* may serve as a channel region, and the channel region may face a bottom surface of the gate structure 110.

The insulating interlayer 130 may cover the gate structure 110. Thus, an upper surface of the insulating interlayer 130 may be higher than an upper surface of the gate structure 110. The upper surface of the insulating interlayer 130 may be substantially flat.

The first contact plug 140 may contact the first impurity region 120*a*. The second contact plug 142 may contact the second impurity region 120*b*. Each of the first and second contact plugs 140 and 142 may pass through the insulating interlayer 130.

In an example embodiment of the present inventive concept, a first distance between the first contact plug 140 and the first sidewall of the gate structure 110 and a second distance between the second contact plug 142 and the second sidewall of the gate structure 110 may be different from each other. As the threshold voltage controlling line 160 is disposed between the first contact plug 140 and the first sidewall of the gate structure 110, the first distance between the first contact plug 140 and the first sidewall of the gate structure 110 may be increased. For example, the first distance may be greater than the second distance.

The third contact plug 144 may contact the gate electrode 110*b*. The third contact plug 144 may pass through the insulating interlayer 130. For example, the third contact plug 144 may pass through a portion of the insulating interlayer 130.

The first conductive line 150 may extend to be connected to an upper surface of the first contact plug 140. The second conductive line 152 may extend to be connected to an upper surface of the second contact plug 142. The third conductive line 154 may extend to be connected to an upper surface of the third contact plug 144.

The threshold voltage controlling line 160 may include a conductive material. The threshold voltage controlling line 160 may be positioned between the gate structure 110 and the first contact plug 140. The threshold voltage controlling line 160 may be spaced apart from the surface (e.g., an upper surface) of the substrate 100, and may face at least a portion of the first impurity region 120*a* of the substrate 100.

In an example embodiment of the present inventive concept, the threshold voltage controlling line 160 may extend in the first direction that is the same as an extension direction of the gate structure 110. The threshold voltage controlling line 160 may extend in a direction substantially perpendicular to a channel direction (e.g., a direction of a channel length) of the transistor. The threshold voltage controlling line 160 may be spaced apart from the first impurity region 120*a*, and may extend to cross the first impurity region 120*a*. For example, the insulating interlayer 130 may be disposed between the threshold voltage controlling line 160 and the first impurity region 120*a*. For example, the threshold voltage controlling line 160 may extend in a direction that crosses the direction in which the first impurity region 120*a* extends. For example, the threshold voltage controlling line 160 may extend to overlap a portion of the first impurity region 120*a*.

In an example embodiment of the present inventive concept, the threshold voltage controlling line 160 may be disposed between the first conductive line 150 and the third conductive line 154. For example, each of the threshold voltage controlling line 160, the first conductive line 150, and the third conductive line 154 may extend in the same direction.

In an example embodiment of the present inventive concept, one voltage controlling line 160 may be disposed between the gate structure 110 and the first contact plug 140.

In an example embodiment of the present inventive concept, the first to third conductive lines 150, 152, and 154 and the threshold voltage controlling line 160 may be positioned on the same plane. For example, the first to third conductive lines 150, 152, and 154 and the threshold voltage controlling line 160 may be positioned at the same height from an upper surface of the substrate 100. As shown in FIGS. 1 and 2, lower surfaces of the first to third conductive lines 150, 152, and 154 and the threshold voltage controlling line 160 may be coplanar with each other, and upper surfaces of the first to third conductive lines 150, 152, and 154 and the threshold voltage controlling line 160 may be coplanar with each other. However, the present inventive concept is not limited thereto.

In an example embodiment of the present invention, as shown in FIG. 3, the lower surfaces of the first to third conductive lines 150, 152, and 154 may be coplanar with each other, and the upper surfaces of the first to third conductive lines 150, 152, and 154 may be coplanar with each other. The lower surface of the threshold voltage controlling line 160 might not be coplanar with the lower surfaces of the first to third conductive lines 150, 152, and 154, and the upper surface of the threshold voltage controlling line 160 might not be coplanar with the upper surfaces of the first to third conductive lines 150, 152, and 154. The lower surface of the threshold voltage controlling line 160 may be positioned on a different plane from the lower surfaces of the first to third conductive lines 150, 152, and 154, and the upper surface of the threshold voltage controlling line 160 may be positioned on a different plane from the upper surfaces of the first to third conductive lines 150, 152, and 154. For example, the threshold voltage controlling line 160 may be disposed on the insulating interlayer 130, and the first to third conductive lines 150, 152, and 154 may be disposed on another insulating interlayer that is disposed on the insulating interlayer 130.

In an example embodiment of the present inventive concept, as shown in FIG. 4, at least one of the lower surfaces of the first to third conductive lines 150, 152, and 154 may be positioned on different plane. For example, the third conductive line 154 may be disposed on the insulating interlayer 130, and the first conductive line 150 and the second conductive line 152 may be disposed on another insulating interlayer 130 that is disposed on the insulating interlayer 130. Further, the threshold voltage controlling line 160 may be positioned between the gate structure 110 and the first contact plug 140, and a position of the threshold voltage controlling line 160 in a vertical direction from the substrate 100 may not be limited.

The threshold voltage controlling line 160 may be formed to adjust the threshold voltage of the transistor. The threshold voltage controlling line 160 might not be electrically connected to the gate structure 110 and the first and second impurity regions 120a and 120b of the transistor.

The threshold voltage controlling line 160 may include a metal or a polysilicon doped with impurities. The metal may include, e.g., aluminum, copper, tungsten, cobalt, or the like.

According to changing the material of the threshold voltage controlling line 160, a resistance of the threshold voltage controlling line 160 may be changed. According to changing the resistance of the material of the threshold voltage controlling line 160, a threshold voltage characteristic of the transistor may be changed by the threshold voltage controlling line 160.

When a voltage is applied to the threshold voltage controlling line 160, a potential difference between the gate electrode 110b and the threshold voltage controlling line 160 and a potential difference between the first impurity region 120a and the threshold voltage controlling line 160 may occur. Thus, electric fields may be generated in the substrate 100 according to the potential differences, and a junction depletion phenomenon may occur at a portion of the first impurity region 120a opposite to the threshold voltage controlling line 160. A depletion region 170, which is a region of the first impurity region 120a in which the junction depletion phenomenon may occur, may have a locally high resistance. For example, a junction breakdown, in which a junction of the first impurity region 120a is partially broken, may occur. Therefore, when the voltage is applied to the threshold voltage controlling line 160, the threshold voltage of the transistor may increase.

When no voltage is applied to the threshold voltage controlling line 160, a first threshold voltage may be applied to the gate electrode 110b so that the transistor may be turned on. However, when a voltage is applied to the threshold voltage controlling line 160, the threshold voltage of the transistor may increase, and thus an operating characteristic of the transistor may be changed. For example, when the first threshold voltage is applied to the gate electrode 110b, the transistor may be turned off, not turned on. If the junction depletion is generated in the first impurity region 120a, the transistor may be continuously turned off during an operation of the semiconductor device in an operating voltage range.

As described above, the threshold voltage of the transistor may be controlled by adjusting the voltage applied to the threshold voltage controlling line 160.

In the transistor, as the number and arrangement of the threshold voltage controlling lines 160 may be changed, electrical characteristics of the transistor may be controlled by changing a position of a region in which the junction depletion phenomenon occurs.

Hereinafter, example embodiments of the present inventive concept, in which the number and arrangement of the threshold voltage controlling lines are different, may be described.

Figure 5:
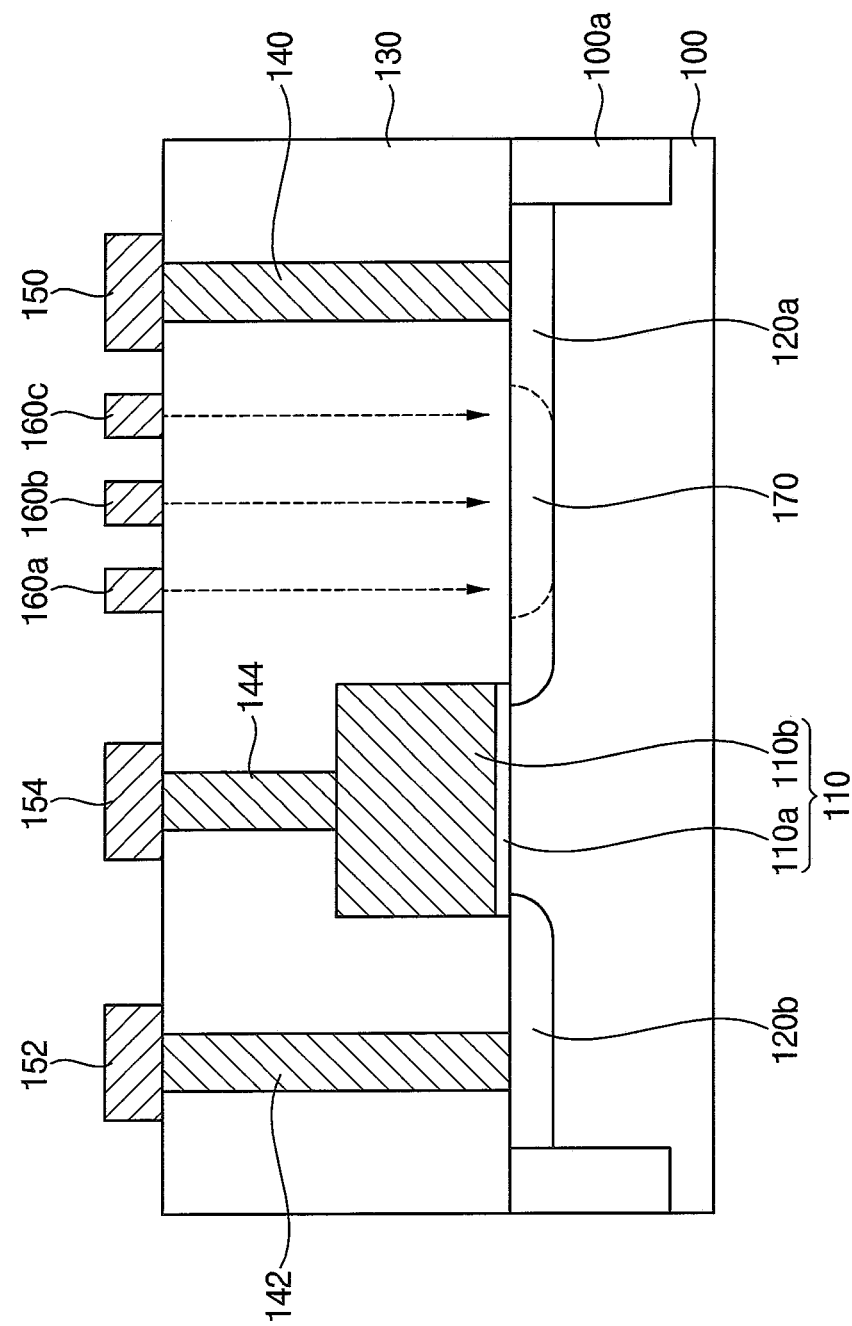
FIGS. 5 and 6 are respectively a cross-sectional view and a perspective view illustrating a transistor capable of controlling a threshold voltage in accordance with an example embodiment of the present inventive concept.
Figure 6:
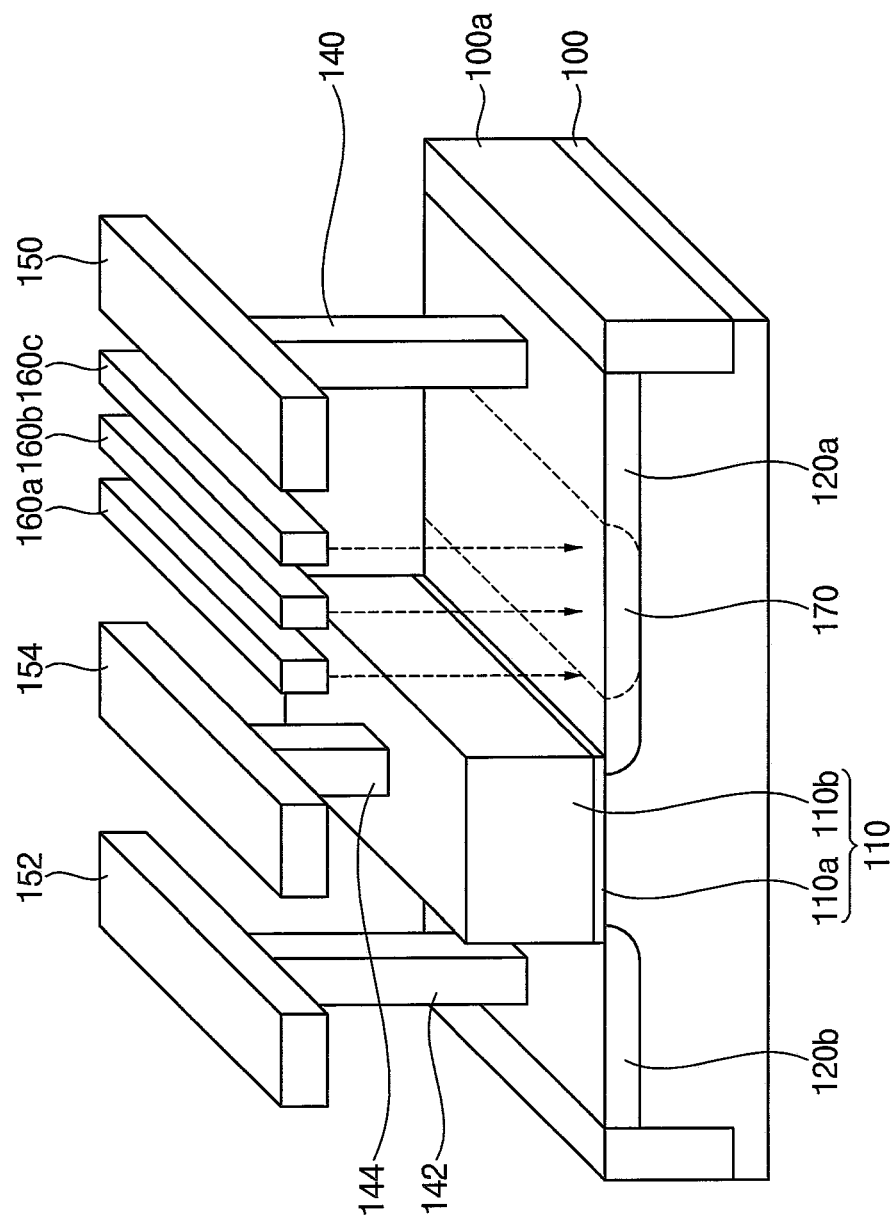

FIGS. 5 and 6 are respectively a cross-sectional view and a perspective view illustrating a transistor capable of controlling a threshold voltage in accordance with an example embodiment of the present inventive concept.

The transistor may be substantially the same as the transistor shown in FIGS. 1 and 2, except for the threshold voltage controlling line. Therefore, the threshold voltage controlling line is mainly described, and redundant descriptions may be omitted.

Referring to FIGS. 5 and 6, the transistor may include a plurality of threshold voltage controlling lines 160a, 160b, and 160c.

The threshold voltage controlling lines 160a, 160b, and 160c may be positioned between the gate structure 110 and the first contact plug 140. The threshold voltage controlling lines 160a, 160b, and 160c may be spaced apart from a surface (e.g., an upper surface) of the substrate 100, and may face at least a portion of the first impurity region 120a of the substrate 100. The threshold voltage controlling lines 160a, 160b, and 160c may extend in the same direction as an extension direction of the gate structure 110. The threshold voltage controlling lines 160a. 160b, and 160c may extend in a direction substantially perpendicular to the channel direction of the transistor. The threshold voltage controlling lines 160a, 160b, and 160c may be spaced apart from the first impurity region 120a, and may extend to cross the first impurity region 120a.

In an example embodiment of the present inventive concept, the plurality of threshold voltage controlling lines 160a, 160b, and 160c may be positioned on the same plane. For example, the lower surfaces of the threshold voltage controlling lines 160a, 160b, and 160c may be coplanar with each other, and the upper surfaces of the threshold voltage controlling lines 160a, 160b, 160c may be coplanar with each other. The plurality of threshold voltage controlling lines 160a, 160b, and 160c may be positioned at the same height from the upper surface of the substrate 100. For example, the plurality of threshold voltage controlling lines 160a, 160b, and 160c may be disposed on the insulating interlayer 130.

For example, as shown in FIGS. 5 and 6, first to third threshold voltage controlling lines 160a, 160b, and 160c may be sequentially disposed from the first sidewall of the gate structure 110. Each of the first to third threshold voltage controlling lines 160a, 160b, and 160c may be formed to control the threshold voltage of the transistor.

A voltage may be applied to at least one of the first to third threshold voltage controlling lines 160a, 160b, and 160c. For example, the voltage may be selectively applied to the first to third threshold voltage controlling lines 160a, 160b, and 160c, or the voltage may be applied to all of the first to third threshold voltage controlling lines 160a, 160b, 160c.

When the voltage is applied to at least one of the first to third threshold voltage controlling lines 160a, 160b, and 160c, the potential difference between the gate electrode 110b and voltage-applied threshold voltage controlling line, which includes the first to third threshold voltage controlling lines 160a, 160b, and 160e, and the potential difference between the first impurity region 120a and the voltage-applied threshold voltage controlling line may be generated. Thus, electric fields may be generated in the substrate 100 according to the potential differences, and a junction depletion phenomenon may occur at a portion of the first impurity region 120a opposite to the voltage-applied threshold voltage controlling line. The depletion region 170, which is a region of first impurity region 120a in which the junction depletion phenomenon may occur, may have a locally high resistance.

For example, the voltages applied to each of the first to third threshold voltage controlling lines 160a, 160b, and 160c may be separately controlled, so that a position of the depletion region 170 may be controlled. Further, the voltages applied to each of the first to third threshold voltage controlling lines 160a, 160b, and 160c may be separately controlled, so that the threshold voltage of the transistor may be controlled.

Figure 7:
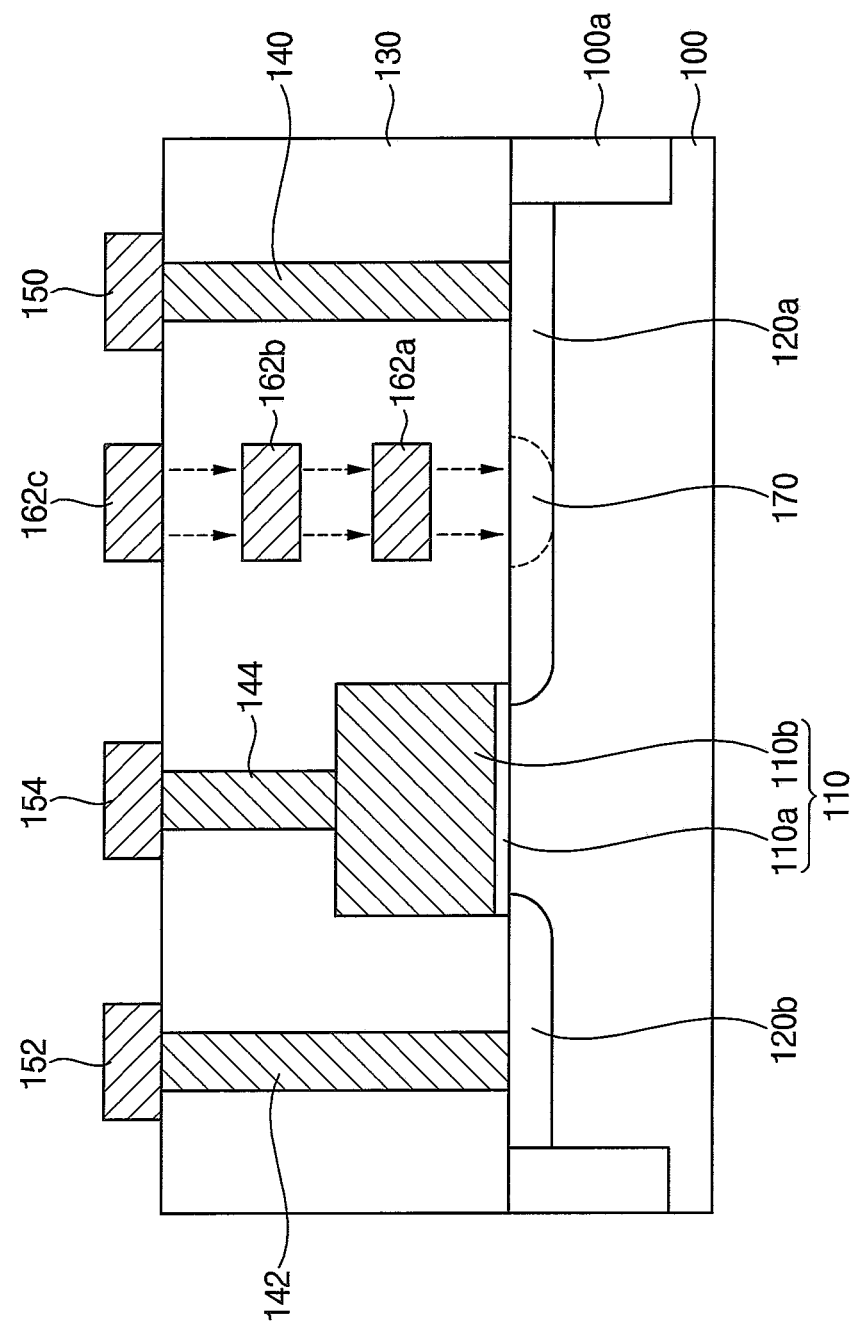
FIGS. 7 and 8 are respectively a cross-sectional view and a perspective view illustrating transistor capable of controlling a threshold voltage in accordance with an example embodiment of the present inventive concept.
Figure 8:
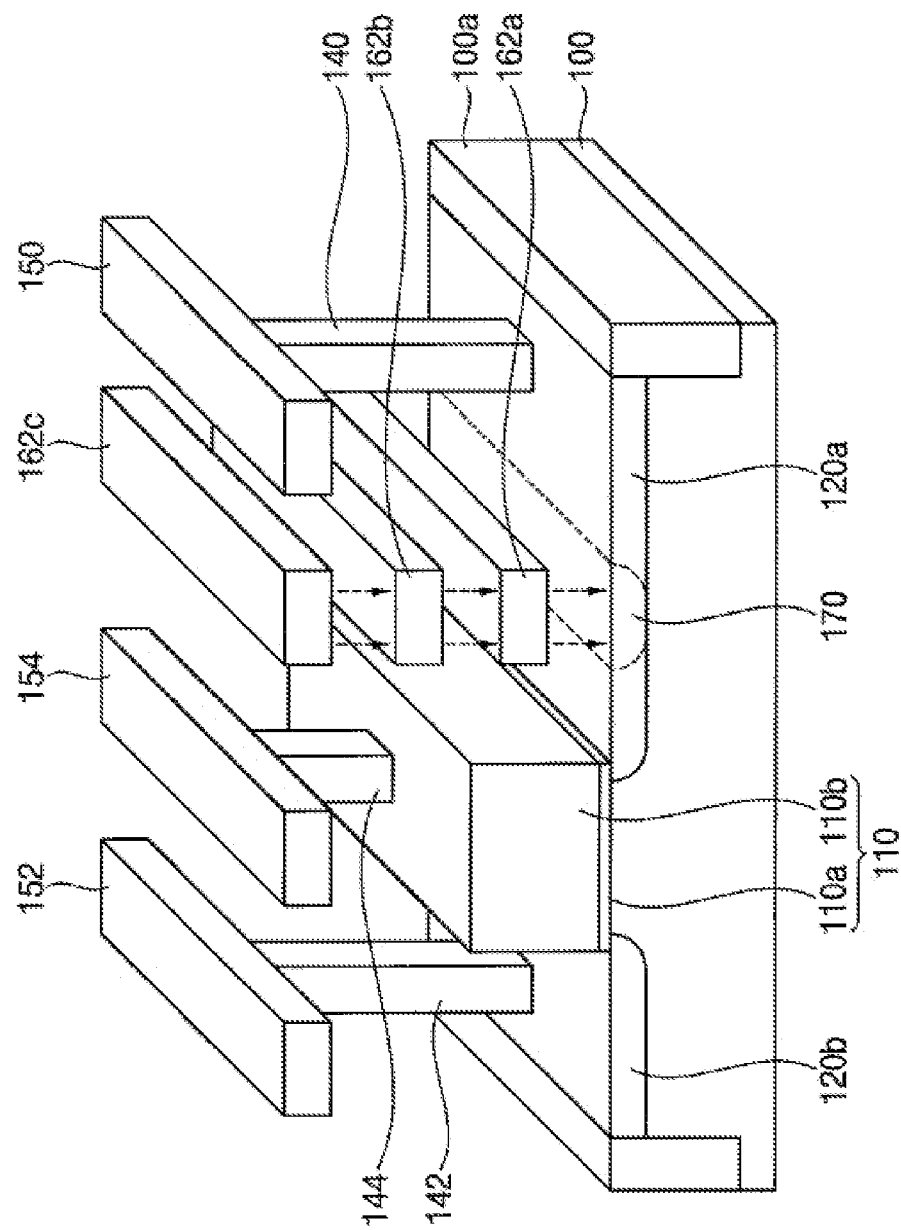

FIGS. 7 and 8 are respectively a cross-sectional view and a perspective view illustrating a transistor capable of controlling a threshold voltage in accordance with an example embodiment of the present inventive concept.

The transistor may be substantially the same as the transistor shown in FIGS. 1 and 2, except for the threshold voltage controlling line. Therefore, the threshold voltage controlling line is mainly described, and redundant descriptions may be omitted.

Referring to FIGS. 7 and 8, the transistor may include a plurality of threshold voltage controlling lines 162a, 162b, and 162c. The plurality of threshold voltage controlling lines 162a, 162b, and 162c may be positioned between the gate structure 110 and the first contact plug 140.

The threshold voltage controlling lines 162a, 162b, and 162c may be positioned at different heights from one another in the vertical direction from the surface (e.g., the upper surface) of the substrate 100. The threshold voltage controlling lines 162a, 162b, and 162c may be spaced apart from the surface of the substrate 100, and may face at least a portion of the first impurity region 120a of the substrate 100. For example, the threshold voltage controlling lines 162a, 162b, and 162c may overlap each other in the vertical direction. However, the present inventive concept is not limited thereto. For example, the threshold voltage controlling lines 162a, 162b, and 162c may be arranged in the vertical direction without overlapping each other.

For example, as shown in FIGS. 7 and 8, first to third threshold voltage controlling lines 162a, 162b, and 162c may be disposed in a sequential order from the surface of the substrate 100. Each of the first to third threshold voltage controlling lines 162a, 162b, and 162c may be formed to control the threshold voltage of the transistor A voltage may be applied to at least one of the first to third threshold voltage controlling lines 162a, 162b, and 162c. For example, the voltage may be selectively applied to the first to third threshold voltage controlling lines 162a, 162b, and 162c, or the voltage may be applied to all of the first to third threshold voltage controlling lines 162a, 162b, 162c.

When the voltage is applied to at least one of the first to third threshold voltage controlling lines 162a, 162b, and 162c, the potential difference between the gate electrode 110b and voltage-applied threshold voltage controlling line, which includes the first to third threshold voltage controlling lines 162a, 162b, and 162c, and the potential difference between the first impurity region 120a and the voltage-applied threshold voltage controlling line may be generated. Thus, electric fields may be generated in the substrate 100 according to the potential differences, and a junction depletion phenomenon may occur at a portion of the first impurity region 120a opposite to the threshold voltage controlling lines 162a, 162b, and 162c. The depletion region 170, which is a region of the first impurity region 120a in which the junction depletion phenomenon may occur, may have a locally high resistance. For example, a voltage applied to the first threshold voltage controlling line 162a adjacent to the substrate 100 may have the greatest effect on the junction depletion phenomenon.

As described above, the threshold voltage of the transistor may be controlled by adjusting the voltages applied to each of the first to third threshold voltage controlling lines 162a, 162b, and 162c.

Figure 9:
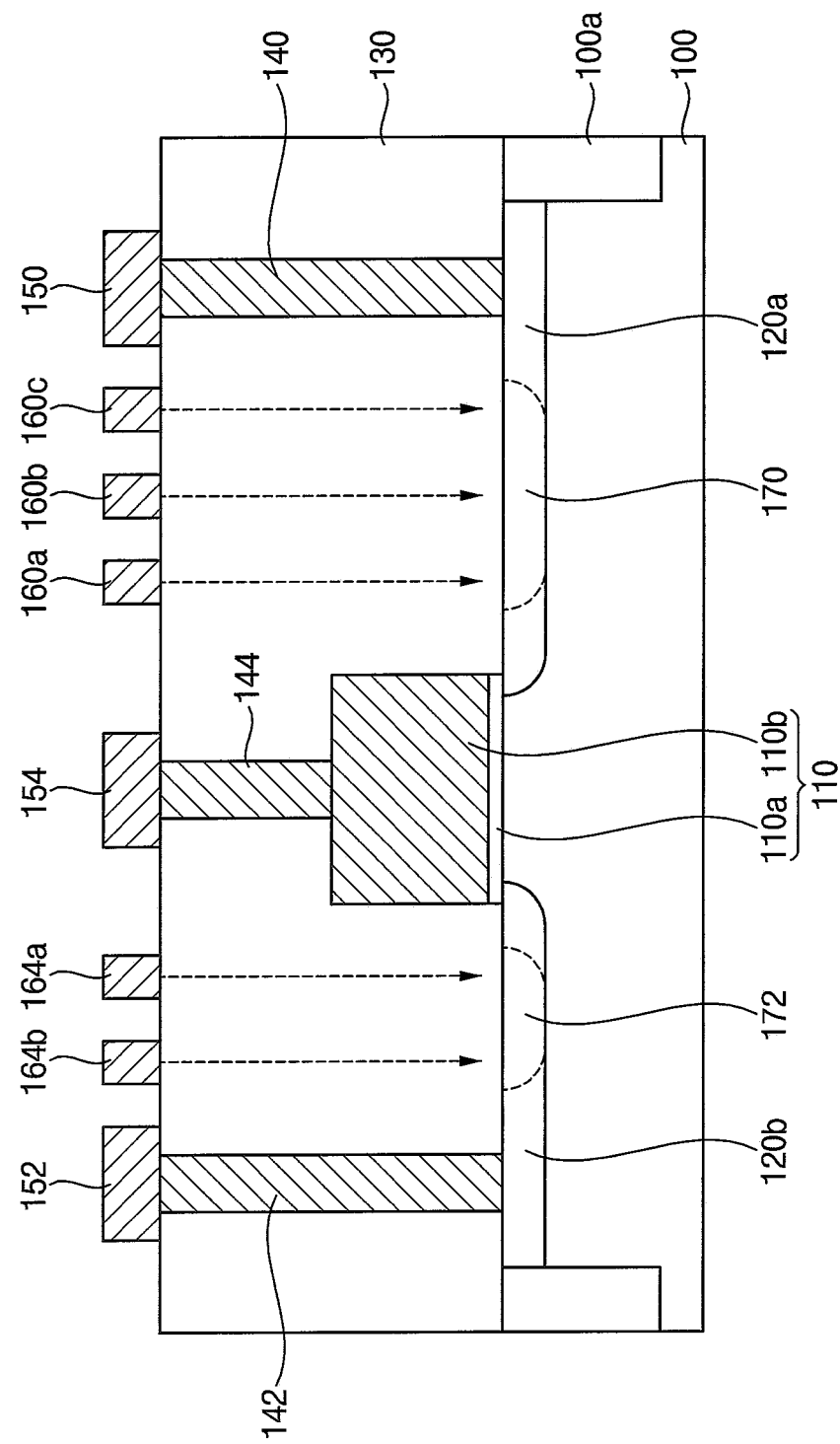
FIGS. 9 and 10 are respectively a cross-sectional view and a perspective view illustrating transistor capable of controlling a threshold voltage in accordance with an example embodiment of the present inventive concept.
Figure 10:
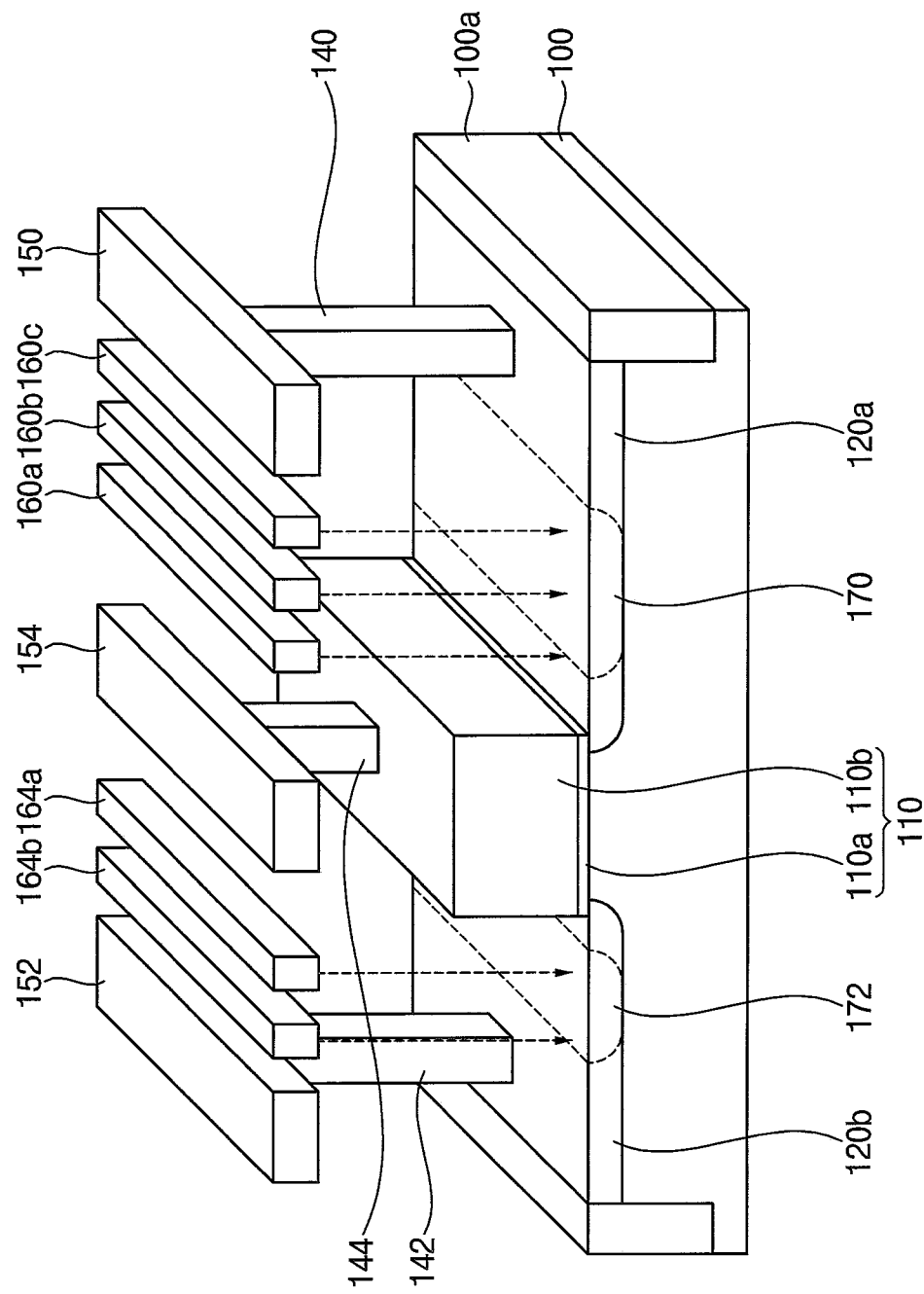

FIGS. 9 and 10 are respectively a cross-sectional view and a perspective view illustrating transistor capable of controlling a threshold voltage in accordance with an example embodiment of the present inventive concept.

The transistor may be substantially the same as the transistor shown in FIGS. 1 and 2, except for the threshold voltage controlling line. Therefore, the threshold voltage controlling line is mainly described, and redundant descriptions may be omitted.

Referring to FIGS. 9 and 10, the transistor may include a first group of threshold voltage controlling lines 160a, 160b, and 160c and a second group of threshold voltage controlling lines 164a and 164b.

The first group of threshold voltage controlling lines 160a, 160b, and 160c may be positioned between the gate structure 110 and the first contact plug 140. The first group of threshold voltage controlling lines 160a, 160b, and 160c may include one or a plurality of threshold voltage controlling lines.

The first group of threshold voltage controlling lines 160a, 160b, and 160c may be spaced apart from the surface (e.g., the upper surface) of the substrate 100, and may face at least a portion of the first impurity region 120a of the substrate 100. The first group of threshold voltage controlling lines 160a, 160b, and 160c may extend in a direction substantially perpendicular to the channel direction, so that the first group of threshold voltage controlling lines 160a, 160b, and 160c may cross the first impurity region 120a.

In an example embodiment of the present inventive concept, when the first group of the threshold voltage controlling lines 160a, 160b, and 160c include a plurality of threshold voltage controlling lines, the plurality of threshold voltage controlling lines may be coplanar with each other. For example, the upper surfaces of the plurality of threshold voltage controlling lines may be coplanar with each other.

The second group of the threshold voltage controlling lines 164a and 164b may be positioned between the gate structure 110 and the second contact plug 142. The second group of the threshold voltage controlling lines 164a and 164b may include one or a plurality of threshold voltage controlling lines.

The second group of the threshold voltage controlling lines 164a and 164b may be spaced apart from the surface of the substrate 100, and may face at least a portion of the second impurity region 120b of the substrate 100. The second group of the threshold voltage controlling lines 164a and 164b may extend in the same direction as an extension direction of the gate structure 110. The second group of the threshold voltage controlling lines 164a and 164b may extend in a direction substantially perpendicular to the channel direction of the transistor. The second group of the threshold voltage controlling lines 164a and 164b may be spaced apart from the second impurity region 120b, and the second group of the threshold voltage controlling lines 164a and 164b may extend to cross the second impurity region 120b. For example, the second group of the threshold voltage controlling lines 164a and 164b may extend in a direction that crosses the direction in which the second impurity region 120b extends. For example, the second group of the threshold voltage controlling lines 164a and 164b may extend to overlap a portion of the second impurity region 120b.

In an example embodiment of the present inventive concept, when the second group of the threshold voltage controlling lines 164a and 164b include a plurality of threshold voltage controlling lines, the plurality of threshold voltage controlling lines may be coplanar with each other. For example, the upper surfaces of the plurality of threshold voltage controlling lines may be coplanar with each other.

For example, as shown in FIGS. 9 and 10, the first group of the threshold voltage controlling lines may include first to third threshold voltage controlling lines 160a, 160b, and 160c, and the second group of the threshold voltage controlling lines may include a fourth and fifth threshold voltage controlling lines 164a and 164b. The first to fifth threshold voltage controlling lines 160a, 160b, 160c, 164a, and 164b may be formed to control the threshold voltage of the transistor:

A voltage may be applied to at least one of the first to third threshold voltage controlling lines 160a, 160b, and 160c. For example, a voltage may be selectively applied to the first to third threshold voltage controlling lines 160a, 160b, and 160c, or a voltage may be applied to all of the first to third threshold voltage controlling lines 160a, 160b, 160c.

In addition, a voltage may be applied to at least one of the fourth and fifth threshold voltage controlling lines 164a and 164b. For example, a voltage may be selectively applied to the fourth and fifth threshold voltage controlling lines 164a and 164b, or a voltage may be applied to all of the fourth and fifth threshold voltage controlling lines 164a and 164b.

When the voltage is applied to at least one of the first to third threshold voltage controlling lines 160a, 160b, and 160c, the junction depletion phenomenon may occur at a portion of the first impurity region 120a opposite to voltage-applied threshold voltage controlling line, which may include the first to third threshold voltage controlling lines 160a, 160b, and 160c. The depletion region (e.g., the first depletion region) 170, which is a region of the first impurity region 120a in which the junction depletion phenomenon may occur, may have a locally high resistance.

The voltages applied to each of the first to third threshold voltage controlling lines 160a, 160b, and 160c may be separately or individually controlled. Thus, a position of the depletion region 170 in the first impurity region 120a may be controlled. Further, the voltages applied to each of the first to third threshold voltage controlling lines 160a, 160b, and 160c may be separately controlled, so that the threshold voltage of the transistor may be controlled.

In addition, when the voltage is applied to at least one of the fourth and fifth threshold voltage controlling lines 164a and 164b, a junction depletion phenomenon occurs in a portion of the second impurity region 120b opposite to voltage-applied threshold voltage controlling line, which may include the fourth and fifth threshold voltage controlling lines 164a and 164b. A second depletion region 172, which is a region of the second impurity region 120b in which the junction depletion phenomenon may occur, may have a locally high resistance.

The voltages applied to each of the fourth and fifth threshold voltage controlling lines 164a and 164b may be separately controlled. Thus, a position of the second depletion region in the second impurity region 120b may be controlled. In addition, the voltages applied to the fourth and fifth threshold voltage controlling lines 164a and 164b may be separately controlled, so that the threshold voltage of the transistor may be controlled.

As described above, at least one threshold voltage controlling line may be formed between the gate electrode structure and the first contact plug, so that the transistor capable of controlling the threshold voltage may be provided.

The transistor capable of controlling the threshold voltage may be used as an anti-fuse cell of a repair circuit in a semiconductor device. Hereinafter, the transistor capable of controlling the threshold voltage serving as an anti-fuse cell of a repair circuit in a semiconductor device is described.

In general, the anti-fuse cell in the semiconductor device may have a structure in which a selection transistor, which is for switching, and a program transistor are connected to each other in series. For example, the anti-fuse cell may include two transistors. However, the present inventive concept is not limited thereto. The program transistor may serve as a rupture transistor that is programmed through an insulation breakdown.

When a defect occurs at a specific address of memory cells in the semiconductor device, the repair circuit may be activated by the insulation breakdown of the program transistor. For example, the program transistor may be ruptured by the insulation breakdown so that the program transistor might not operate as a switching device. When a defective address of the memory cell having a defect is input, the defective address may be replaced with an address of a redundancy cell. Thus, the redundancy cell may be operated, so that an operation failure of the semiconductor device might not occur.

However, when a gate insulation layer of the program transistor is ruptured, the program transistor may be permanently unusable. Thus, the program transistor might not be restored to its state before the insulation breakdown. Failures of the redundancy cell may be already included or characteristics of the redundancy cell might not be good. In this case, even if the memory cell having a defect is replaced with the redundancy cell, the operation failure of the semiconductor device may occur.

Figure 11:
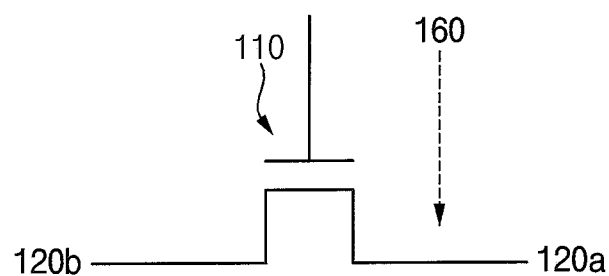
FIGS. 11 and 12 are circuit diagrams of an anti-fuse cell used in a repair circuit in a semiconductor device in accordance with an example embodiment of the present inventive concept.
Figure 12:
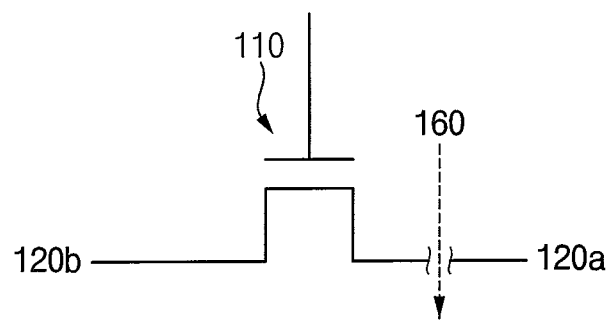

FIGS. 11 and 12 are circuit diagrams of an anti-fuse cell used in a repair circuit in a semiconductor device in accordance with an example embodiment of the present inventive concept.

Hereinafter, it is described that the anti-fuse cell includes one of the transistors capable of controlling the threshold voltage described with reference to the respective example embodiments.

FIG. 11 illustrates a case in which no voltage is applied to the threshold voltage controlling lines, and FIG. 12 illustrates a case in which a voltage is applied to the threshold voltage controlling lines.

Referring to FIGS. 11 and 12, the anti-fuse cell may include one transistor capable of controlling a threshold voltage. The anti-fuse cell may include only one transistor, but may be operated to have the same function as a typical anti-fuse cell including two transistors.

The second impurity region 120*b* of the transistor may be electrically connected to a bit line or a word line of a memory cell.

As shown in FIG. 11, a voltage might not be applied to the threshold voltage controlling line 160, and the threshold voltage controlling line 160 may not be driven. In this case, the gate structure 110 and the first and second impurity regions 120*a* and 120*b* may serve as a selection transistor of a typical anti-fuse cell. In this case, the anti-fuse cell may be operated in the same manner as the program transistor of the typical anti-fuse cell, which may be in a state in which the insulation breakdown might not occur.

As shown in FIG. 12, when a voltage is applied to the threshold voltage controlling line 160 to drive the threshold voltage controlling line 160, the anti-fuse cell may be operated in the same manner as the program transistor that ruptures in the typical anti-fuse cell. When the threshold voltage controlling line 160 is driven, the transistor might not be turned on even when a voltage that is equal to or greater than the first threshold voltage is applied to the gate electrode 110*b* of the transistor. Thus, the anti-fuse cell may be operated in the same manner as the program transistor of the typical anti-fuse cell, which may be in a state in which the insulation breakdown occurs.

When the threshold voltage controlling line 160 is driven, electrical signals may be applied to a bit line or a word line of the redundancy cell rather than a bit line or a word line of the memory cell. Thus, the memory cell may be replaced with the redundancy cell, so that the memory cell may be repaired.

As described above, the anti-fuse cell constituting the repair circuit may include only one transistor; however, the present inventive concept is not limited thereto. As the number of the transistor included in the anti-fuse cell is decreased, a horizontal area of the substrate required to form the repair circuit may be decreased.

The transistor may be continuously turned off without the insulation breakdown of the transistor, so that the memory cell may be replaced with the redundancy cell. Thus, the failures of the redundancy cell and the characteristic of the redundancy cell may be inspected by an electrical test without the insulation breakdown of the transistor.

When it is determined that no defect occurs in the redundancy cell after the electrical test, the transistor may perform a repair process to permanently disable the transistor by the insulation breakdown. Thus, an operation failure due to the defects of the redundancy cell might not occur, after the repair process.

In addition, the transistor capable of controlling the threshold voltage may also be used as a memory cell in a semiconductor device. Hereinafter, the memory cell in the semiconductor device including the transistor is described.

Figure 13:
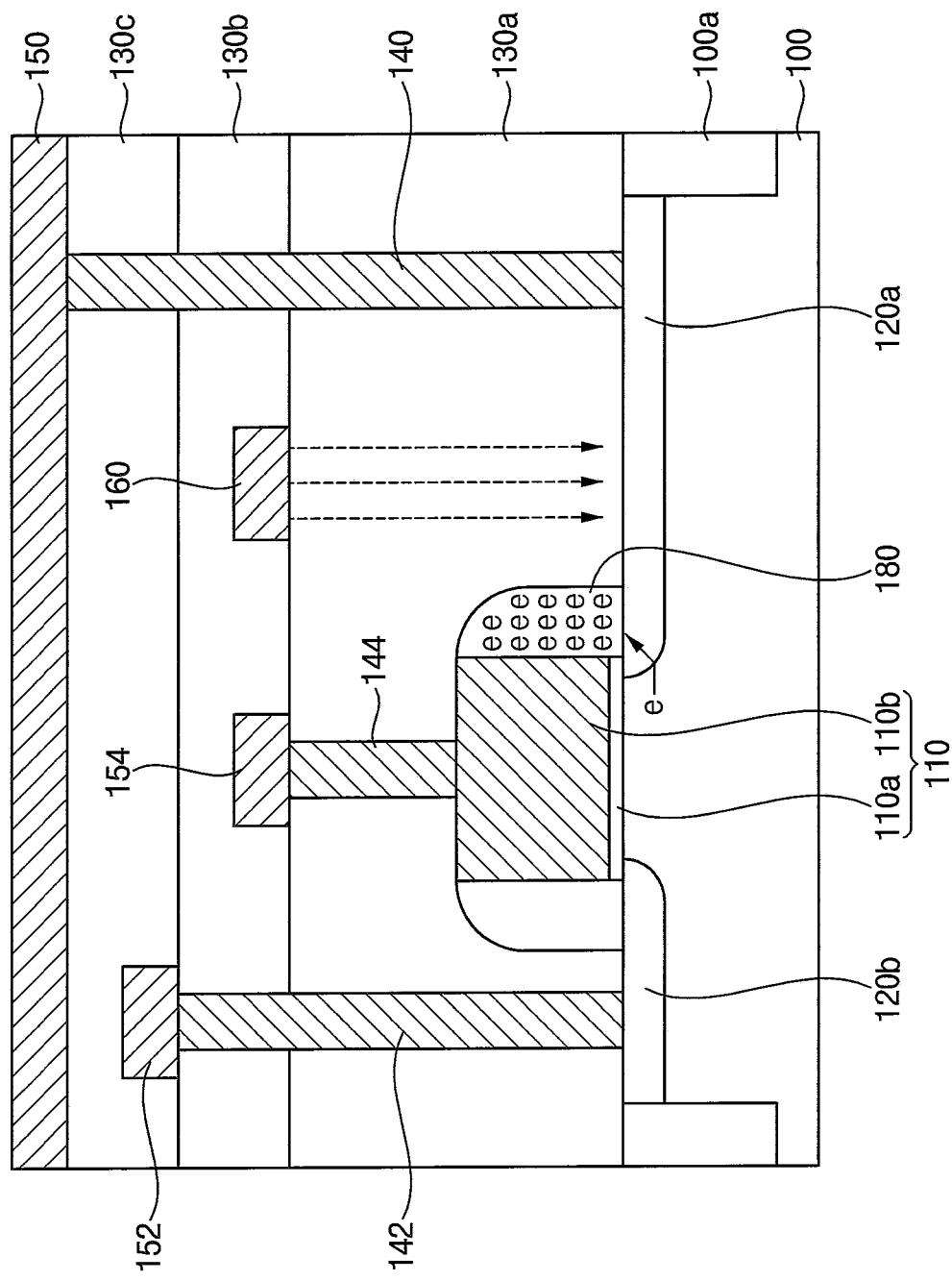
FIGS. 13 and 14 are respectively a cross-sectional view and a perspective view of a memory cell in accordance with an example embodiment of the present inventive concept.
Figure 14:
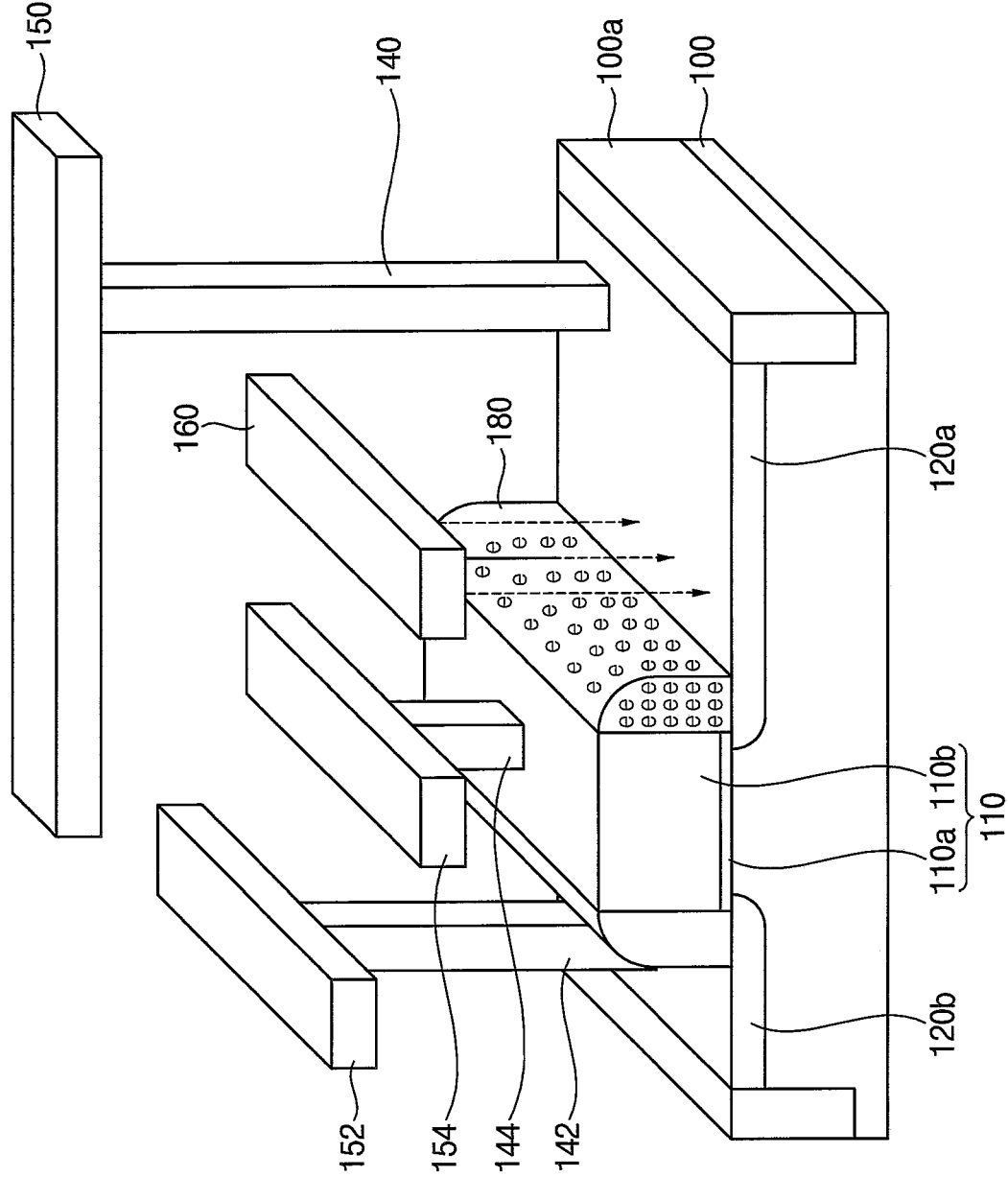

FIGS. 13 and 14 are respectively a cross-sectional view and a perspective view of a memory cell in accordance with an example embodiment of the present inventive concept.

Referring to FIGS. 13 and 14, the memory cell may be formed on a substrate 100. The memory cell may include a gate structure 110, a charge trap spacer 180, a first impurity region 120*a*, a second impurity region 120*b*, a first contact plug 140, a second contact plug 142, a third contact plug 144, a first conductive line 150, a second conductive line 152, a third conductive line 154, and a threshold voltage controlling line 160. Further, first to third insulating interlayers 130*a*, 130*b*, and 130*c* may be formed on the substrate 100.

The substrate 100 may be divided into an active region and an isolation region 100*a*.

The gate structure 110, the first impurity region 120*a*, and the second impurity region 120*b* may be substantially the same as those described with reference to FIGS. 1 and 2, respectively.

The charge trap spacer 180 may be formed on a sidewall of the gate structure 110. The charge trap spacer 180 may include a material for trapping or detrapping of charges. The charge trap spacer 180 may include, e.g., silicon nitride.

The first insulating interlayer 130*a* may cover the gate structure 110 and the charge trap spacer 180. The second and third insulating interlayers 130*b* and 130*c* may be formed on the first insulating interlayer 130*a*. The first to third insulating interlayers 130*a*, 130*b*, and 130*c* may include, for example, silicon oxide. For example, the first to third insulating interlayers 130*a*, 130*b*, and 130*c* may include the same material as each other, so that the first to third insulating interlayers 130*a*, 130*b*, and 130*c* may be merged with each other to form one insulating interlayer.

The first contact plug 140 may be disposed on the first impurity region 120*a*. For example, the first contact plug 140 may contact the first impurity region 120*a*. The second contact plug 142 may be disposed on the second impurity region 120*b*. For example, the second contact plug 142 may contact the second impurity region 120*b*.

In an example embodiment of the present inventive concept, the first contact plug 140 may pass through the third insulating interlayer 130*c*, the second insulating interlayer 130*b*, and the first insulating interlayer 130*a*. In an example embodiment of the present inventive concept, the second contact plug 142 may pass through the second insulating interlayer 130*b* and the first insulating interlayer 130*a*. Thus, an upper surface of the first contact plug 140 and an upper surface of the second contact plug 142 may be positioned at different heights from each other, with respect to an upper surface of the substrate 100.

In an example embodiment of the present inventive concept, a first distance, which is between the first contact plug 140 and a first sidewall of the gate structure 110, and a second distance, which is between the second contact plug 142 and a second sidewall of the gate structure 110, may be different from each other. For example, the first distance may be greater than the second distance.

The third contact plug 144 may be disposed on the gate electrode 110b. For example, the third contact plug 144 may contact the gate electrode 110b. In an example embodiment of the present inventive concept, the third contact plug 144 may pass through the first insulating interlayer 130a. An upper surface of the third contact plug 144 and the upper surface of the first contact plug 140 may be positioned at different heights from each other, with respect to the upper surface of the substrate to each other.

The first conductive line 150 may extend so as to be connected to the upper surface of the first contact plug 140. The first conductive line 150 may be formed on the third insulating interlayer 130c. The second conductive line 152 may extend so as to be connected to the upper surface of the second contact plug 142. The second conductive line 152 may be formed on the second insulating interlayer 130b. The third conductive line 154 may extend so as to be connected to an upper surface of the gate electrode 110b. The third conductive line 154 may be formed on the first insulating interlayer 130a.

The threshold voltage controlling line 160 may be positioned between the gate structure 110 and the first contact plug 140. The threshold voltage controlling line 160 may be spaced apart from the surface of the substrate 100, and may face at least a portion of the first impurity region 120a of the substrate 100.

In an example embodiment of the present inventive concept, the threshold voltage controlling line 160 may be disposed on the first insulating interlayer 130a.

The threshold voltage controlling line 160 may extend in the same direction as an extension direction of the gate structure 110. The threshold voltage controlling line 160 may extend in a direction substantially perpendicular to a channel direction, and may extend to cross the first impurity region 120a.

In the memory cell, when a voltage is applied to the threshold voltage controlling line 160, a potential difference, which is between the gate electrode 110b and the threshold voltage controlling line 160, and a potential difference, which is between the first impurity region 120a and the threshold voltage controlling line 160, may occur. Thus, electric fields are generated in the substrate 100 according to the potential differences, and a junction depletion phenomenon may occur in a portion of the first impurity region 120a opposite to the threshold voltage controlling line 160.

When the voltages applied to the threshold voltage controlling line 160, the gate electrode 110b and the first impurity region 120a are respectively controlled, charges of the channel region may be trapped in the charge trap spacer 180. A resistance of the first impurity region 120a facing a lower surface of the charge trap spacer 180 may be increased by the trapped charges in the charge trap spacer 180. Thus, the threshold voltage of the transistor may be changed by the trapped charges in the charge trap spacer 180. For example, when charges are trapped in the charge trap spacer 180, the threshold voltage of the transistor may increase, and thus data may be programmed in the transistor.

In addition, when a voltage of a reverse direction (i.e., a negative voltage) is applied to the threshold voltage controlling line 160, the charges trapped in the charge trap spacer 180 may be detrapped to the substrate. Thus, data stored in the transistor may be erased.

As described above, the transistor including the charge trap spacer 180 and the threshold voltage controlling line 160 may serve as a memory cell capable of programming and erasing of data.

The memory cell according to an example embodiment of the present inventive concept may have a structure in which the charge trap spacer is further included in each transistor described with reference to FIGS. 3 to 10.

Memory cells may be arranged to have an array structure. Hereinafter, a memory cell array is described.

Figure 15:
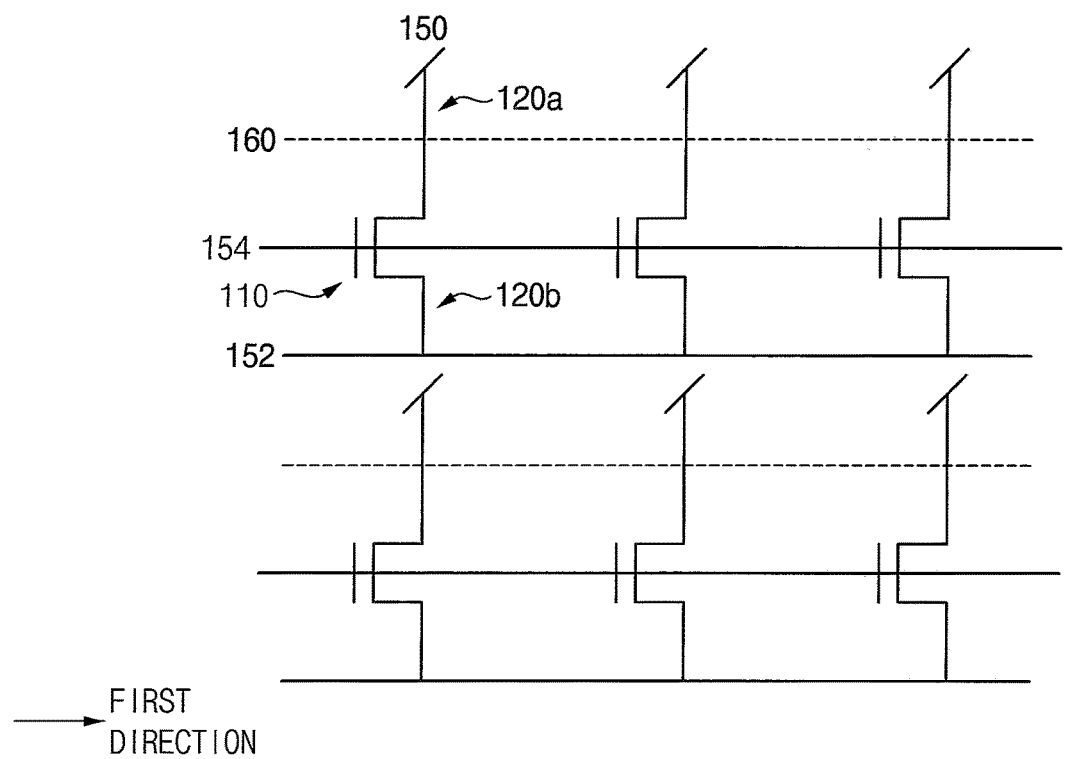
FIG. 15 is a circuit diagram illustrating a memory cell array in accordance with an example embodiment of the present inventive concept.

FIG. 15 is a circuit diagram illustrating a memory cell array in accordance with an example embodiment of the present inventive concept.

Referring to FIG. 15, transistors including the gate structure 110, the first impurity region 120a, and the second impurity region 120b may be arranged in a first direction and a second direction substantially perpendicular to each other.

A first conductive line 150 electrically connected to the first impurity region 120a may be extend in a direction, and a third conductive line 154 electrically connected to the gate electrode may extend in a direction substantially perpendicular to an extension direction of the first conductive line 150. The first conductive line 150 and the third conductive line 154 may extend in directions that are substantially perpendicular to each other.

The third conductive line 154 may extend in the first direction, and may be electrically connected to gate electrodes arranged in the first direction.

The first conductive line 150 may extend in the second direction substantially perpendicular to the first direction, and may be electrically connected to the first impurity regions 120a disposed adjacent to the first conductive line 150 in the second direction.

The threshold voltage controlling line 160 may extend in a direction substantially perpendicular to a channel direction of the transistor. For example, the threshold voltage controlling line 160 may extend in the first direction.

In an example embodiment of the present inventive concept, as shown in FIG. 15, the second conductive line 152 may extend in the first direction. In addition, the second conductive line 152 may extend in the second direction.

As described above, the memory device may include the memory cells having the array structure.

Figure 16:
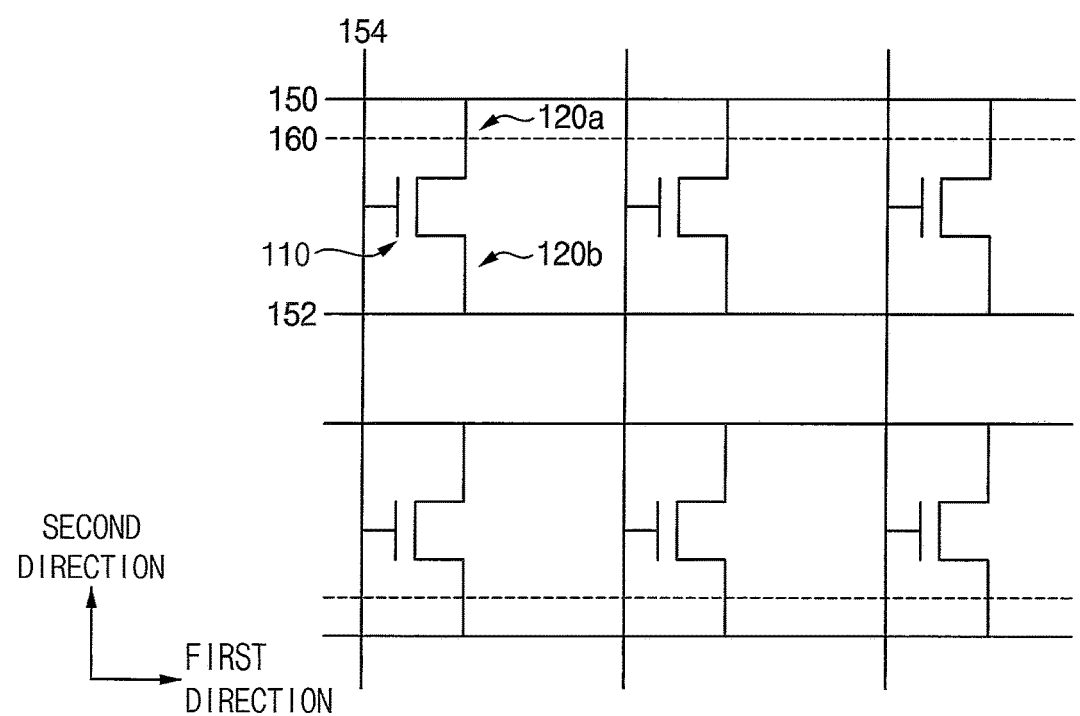
FIG. 16 is a circuit diagram illustrating a memory cell array in accordance with an example embodiment of the present inventive concept.

FIG. 16 is a circuit diagram illustrating a memory cell array in accordance with an example embodiment of the present inventive concept.

Referring to FIG. 16, transistors including the gate structure 110, the first impurity region 120a, and the second impurity region 120b may be arranged in the first direction and the second direction that is substantially perpendicular to the first direction.

A first conductive line 150 electrically connected to the first impurity region 120a may be extend in a direction, and a third conductive line 154 electrically connected to the gate electrode may extend in a direction substantially perpendicular to an extension direction of the first conductive line 150.

The third conductive line 154 may extend in the second direction, and may be electrically connected to gate electrodes arranged in the second direction.

The first conductive line 150 may extend in the first direction, and may be electrically connected to the first impurity regions 120a arranged in the first direction.

The threshold voltage controlling line 160 may extend in a direction substantially perpendicular to a channel direction of the transistor. For example, the threshold voltage controlling line 160 may extend in the first direction.

In an example embodiment of the present inventive concept, as shown in FIG. 16, the second conductive line 152 may extend in the first direction. The second conductive lines 152 facing each other may be merged with each other to form one common second conductive line.

In addition, the second conductive line 152 may extend in the second direction.

As described above, the memory device may include the memory cells having the array structure.

Hereinafter, a method for manufacturing a transistor capable of controlling a threshold voltage in accordance with an example embodiment of the present inventive concept is described.

Figure 17:
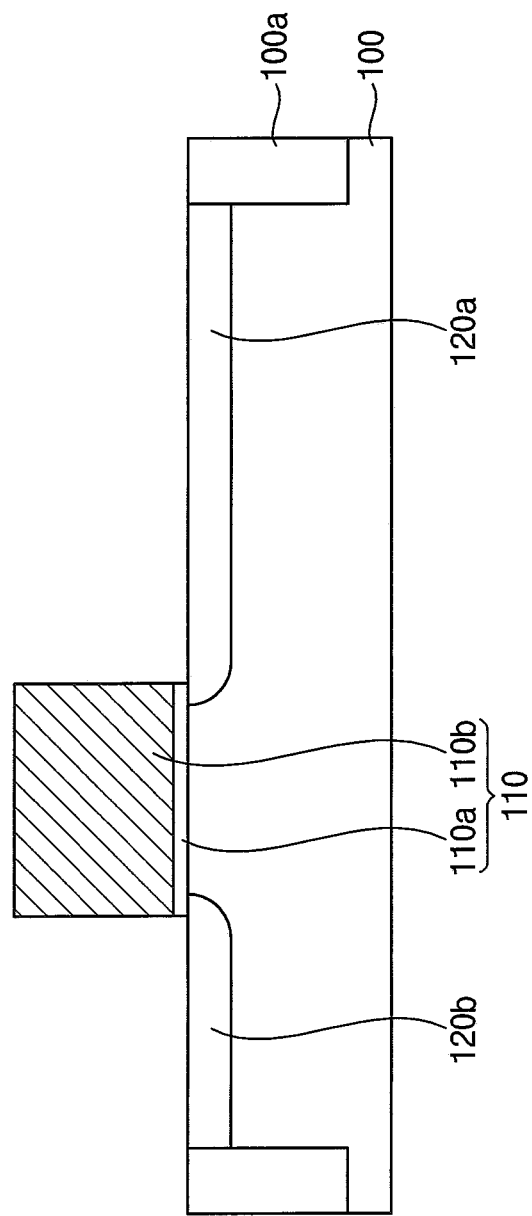
FIGS. 17, 18 and 19 are cross-sectional views illustrating a method for manufacturing a transistor capable of controlling a threshold voltage in accordance with an example embodiment of the present inventive concept.
Figure 18:
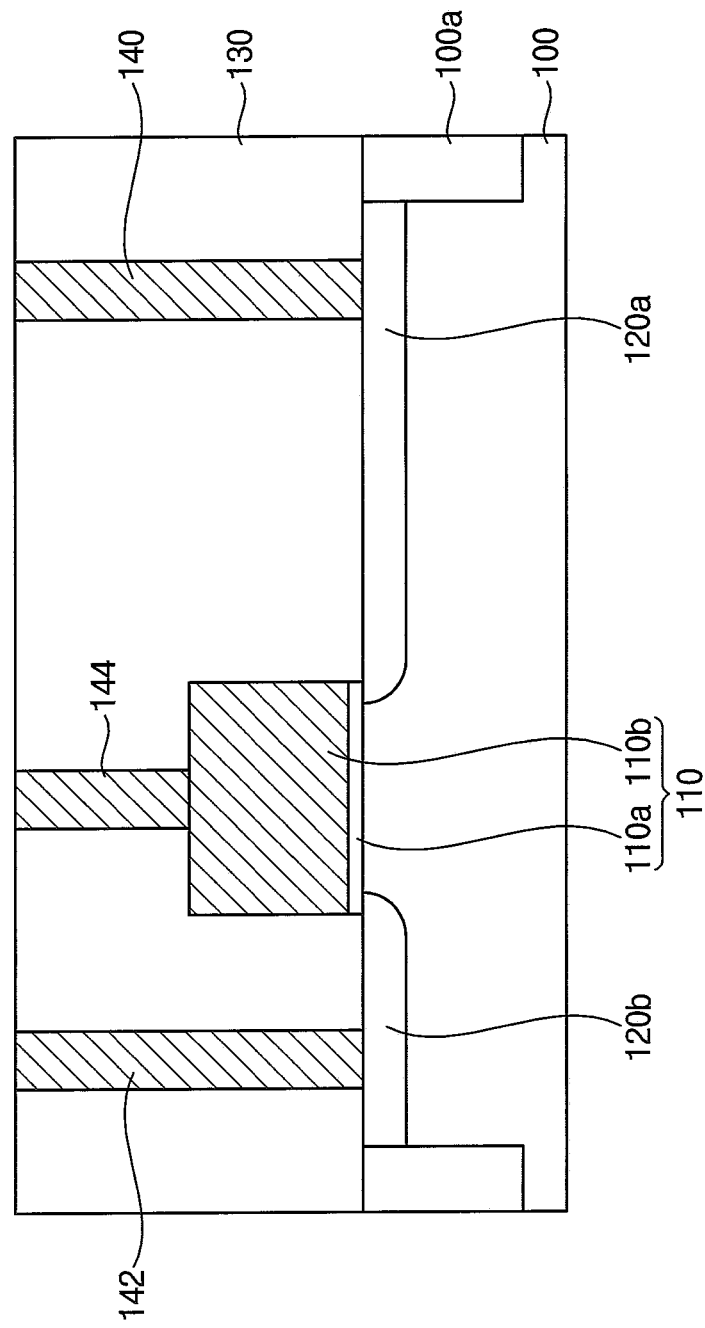
Figure 19:
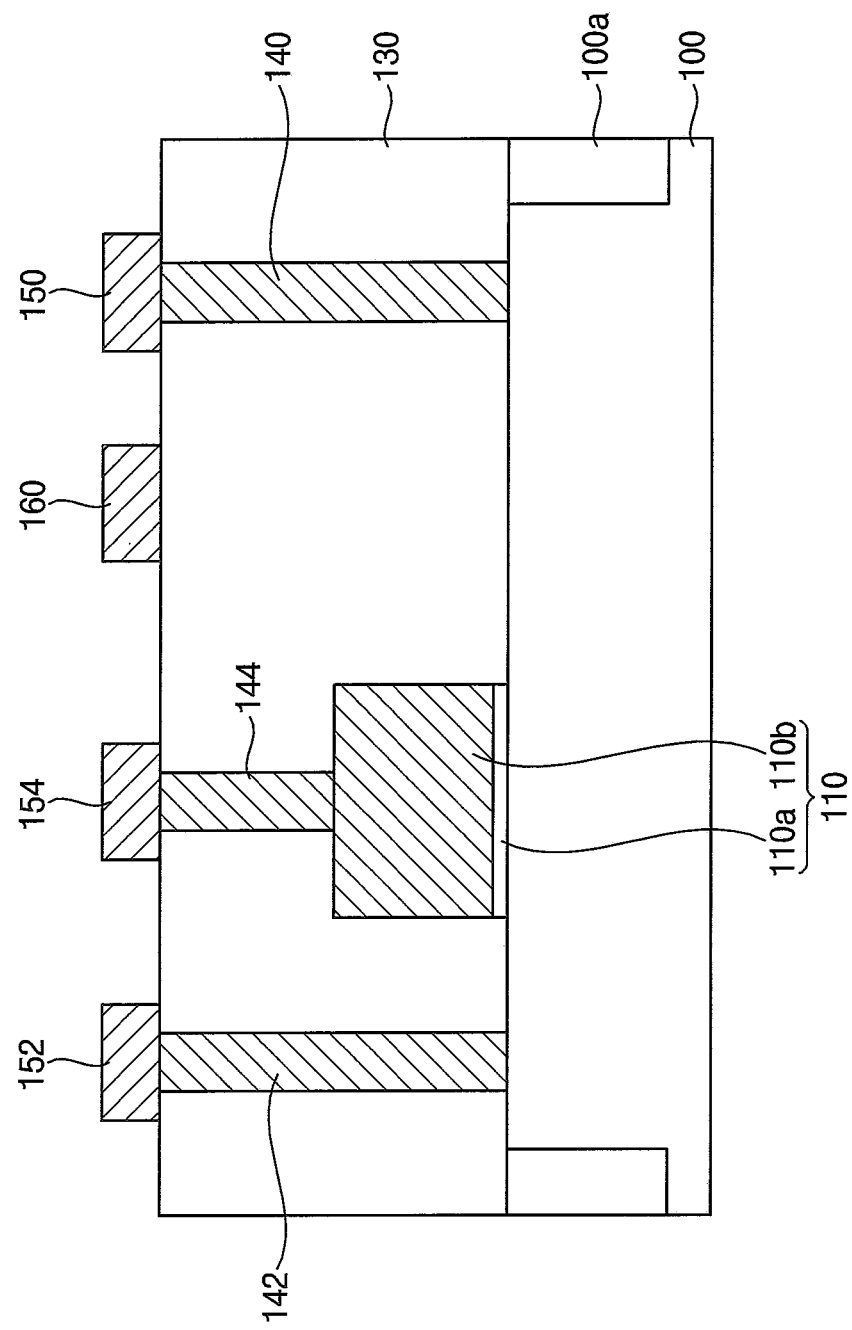

FIGS. 17 to 19 are cross-sectional views illustrating a method for manufacturing a transistor capable of controlling a threshold voltage in accordance with an example embodiment of the present inventive concept.

Referring to FIG. 17, a device isolation process may be performed on a substrate 100 to form an isolation region 100a. Thus, the substrate 100 may be divided into an active region and the isolation region.

A gate insulation layer and a gate electrode layer may be formed on the substrate 100; and the gate insulation layer and the gate electrode layer may be patterned to form a gate structure 110. The gate structure 110 may have a gate insulation layer 110a and a gate electrode 110b stacked.

A capping layer pattern may be formed on the gate electrode layer, and the gate electrode layer and the gate insulation layer 110a may be patterned using the capping layer pattern as an etching mask to form the gate structure 110. In this case, the gate structure may include the capping layer pattern formed on the gate electrode 110b.

In an example embodiment of the present inventive concept, a charge trap spacer may be formed on a sidewall of the gate structure 110. In this case, the memory cell shown in FIGS. 13 and 14 may be formed by performing the same subsequent processes.

Impurities may be implanted onto portions of a surface of the substrate that are adjacent to both sides of the gate structure 110 to form a first impurity region 120a and a second impurity region 120b.

Referring to FIG. 18, an insulating interlayer 130 may be formed on the substrate 100 to cover the gate structure 110. The insulating interlayer 130 may include, for example, silicon oxide.

Portions of the insulating interlayer 130 may be etched to form a first contact hole, a second contact hole, and a third contact hole. The first contact hole exposes the first impurity region 120a, and the second contact hole exposes the second impurity region 120b. The third contact hole exposes an upper surface of the gate electrode 110b.

Thereafter, a conductive material may fill the first to third contact holes, and the conductive material may be planarized until an upper surface of the insulating interlayer 130 is exposed so that the first to third contact plugs 140, 142, and 144 may be formed, respectively.

In this case, a first distance, which is between the first contact plug 140 and a first sidewall of the gate structure 110, and a second distance, which is between the second contact plug 142 and a second sidewall of the gate structure 110, may be different from each other. For example, the first distance may be greater than the second distance.

Referring to FIG. 19, a first conductive line 150, a second conductive line 152, a third conductive line 154 and a threshold voltage controlling line 160 may be formed on the first to third contact plugs 140, 142, 144 and the insulating interlayer 130.

The first conductive line 150 may be disposed on an upper surface of the first contact plug 140. For example, the first conductive line 150 may contact an upper surface of the first contact plug 140. The second conductive line 152 may be disposed on an upper surface of the second contact plug 142. For example, the second conductive line 152 may contact an upper surface of the second contact plug 142. The third conductive line 154 may be disposed on an upper surface of the third contact plug 144. For example, the third conductive line 154 may contact an upper surface of the third contact plug 144. The threshold voltage controlling line 160 may be disposed on the insulating interlayer 130. The threshold voltage controlling line 160 may extend in the same direction as the extension direction of the gate structure 110. The threshold voltage controlling line 160 may be positioned between the gate structure 110 and the first contact plug 140. The threshold voltage controlling line 160 might not be electrically connected to the gate structure 110 and the first and second impurity regions 120a and 120b of the transistor.

In an example embodiment of the present inventive concept, a conductive layer may be formed on the first to third contact plugs 140, 142 and 144 and the insulating interlayer 130, and the conductive layer may be patterned to form the first conductive line 150, the second conductive line 152, the third conductive line 154, and the threshold voltage controlling line 160.

In an example embodiment of the present inventive concept, an additional insulating interlayer may be formed on the first to third contact plugs 140, 142 and 144 and the insulating interlayer 130, and the additional insulating interlayer may be etched to form trenches. Conductive patterns may be formed to fill the trenches, so that the first conductive line 150, the second conductive line 152, the third conductive line 154, and the threshold voltage controlling line 160 may be formed in the trenches, respectively.

In an example embodiment of the present inventive concept, a plurality of the threshold voltage controlling lines 160 may be formed. In this case, the transistor shown in FIGS. 5 and 6 may be formed.

In an example embodiment of the present inventive concept, a plurality of the threshold voltage controlling lines 160 may be formed, and an additional threshold voltage controlling line may be formed between the gate structure 110 and the second contact plug 142. In this case, the transistor shown in FIGS. 9 and 10 may be formed.

FIGS. 20 to 24 are cross-sectional views illustrating a method for manufacturing a transistor capable of controlling a threshold voltage in accordance with an example embodiment of the present inventive concept.

Figure 20:
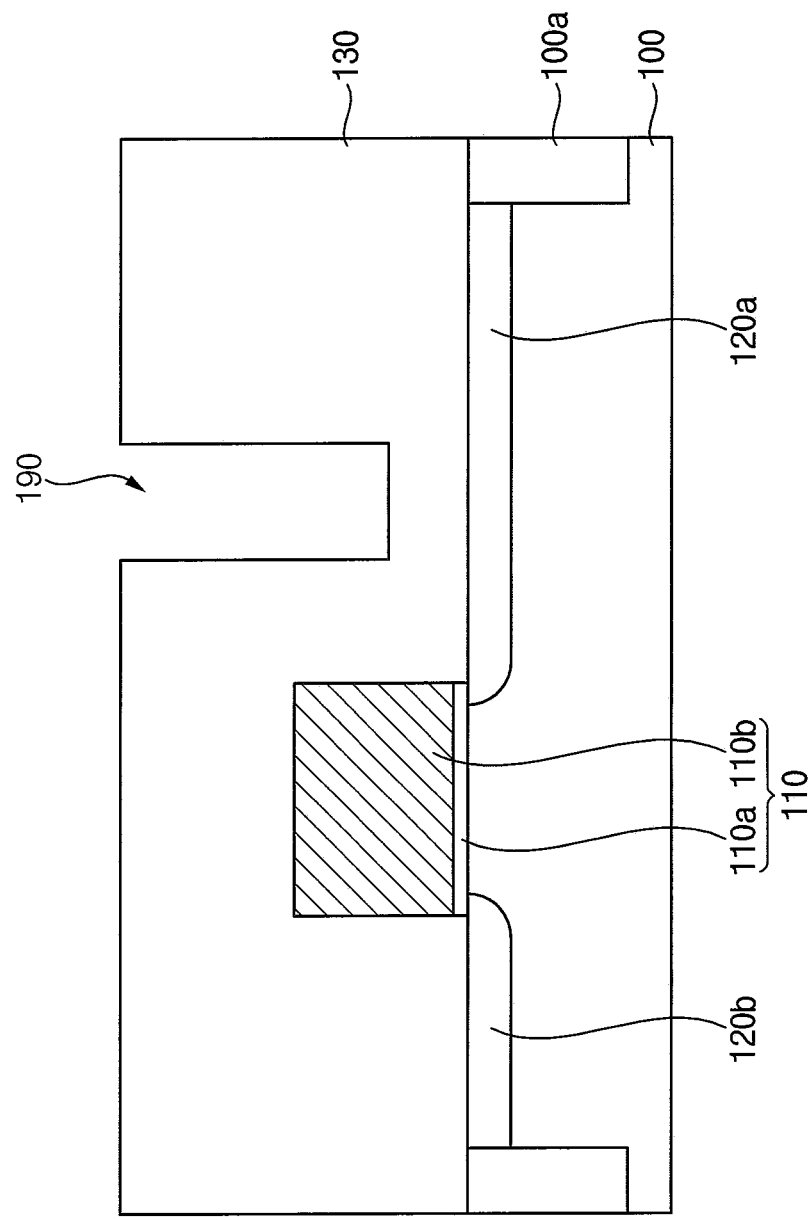
FIGS. 20, 21, 22, 23, and 24 are cross-sectional views illustrating a method for manufacturing a transistor capable of controlling a threshold voltage in accordance with an example embodiment of the present inventive concept.

Referring to FIG. 20, the gate structure 110, the first impurity region 120a, and the second impurity region 120b may be formed by performing substantially the same process as that described with reference to FIG. 17.

The insulating interlayer 130 may be formed on the substrate 100 to cover the gate structure 110.

A portion of the insulating interlayer 130 may be etched to form a trench 190 for forming the threshold voltage controlling line. As the trench 190 may be formed so as to not completely pass through the insulating interlayer 130, a bottom surface of the trench 190 may expose the insulating interlayer 130. The trench 190 may be positioned between the gate structure 110 and a portion of the insulating interlayer 130 in which the first contact plug is formed.

Figure 21:
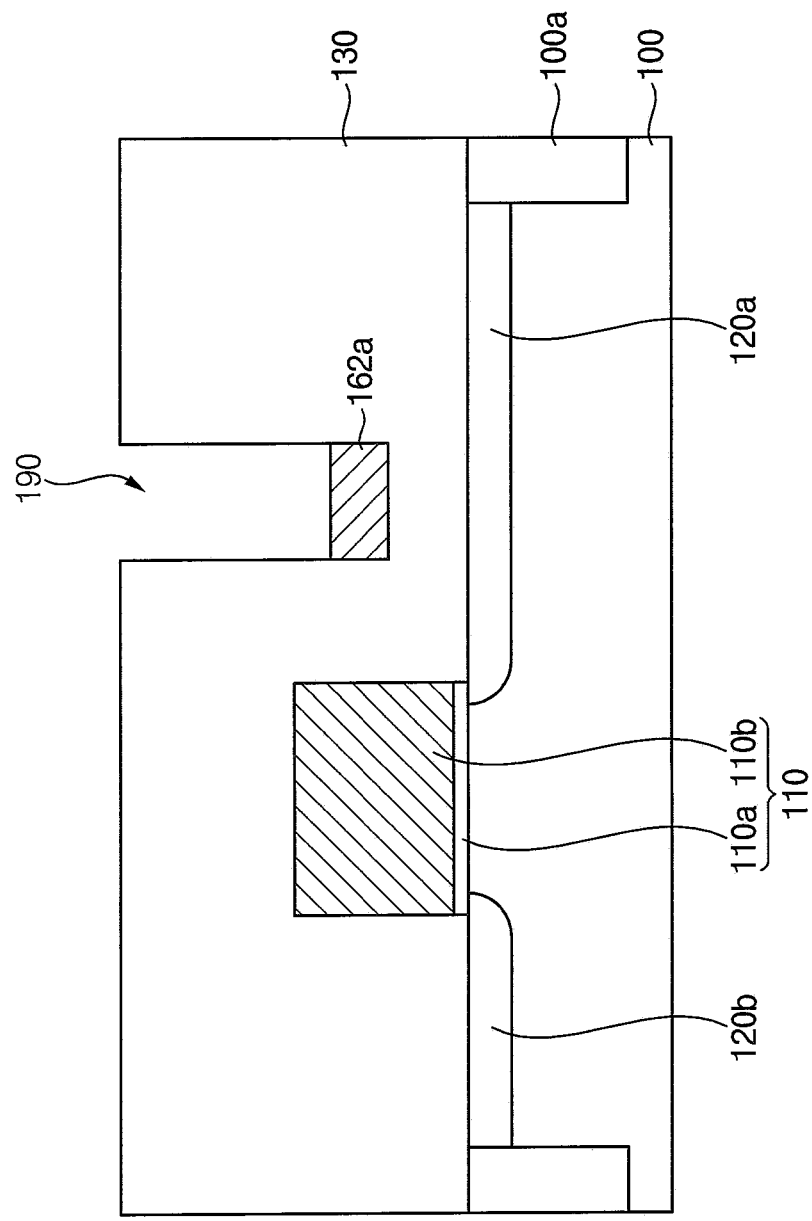

Referring to FIG. 21, a conductive layer may be formed to fill the trench 190. Thereafter, the conductive layer may be etched back to form a first threshold voltage controlling line 162a at a lower portion of the trench 190.

Figure 22:
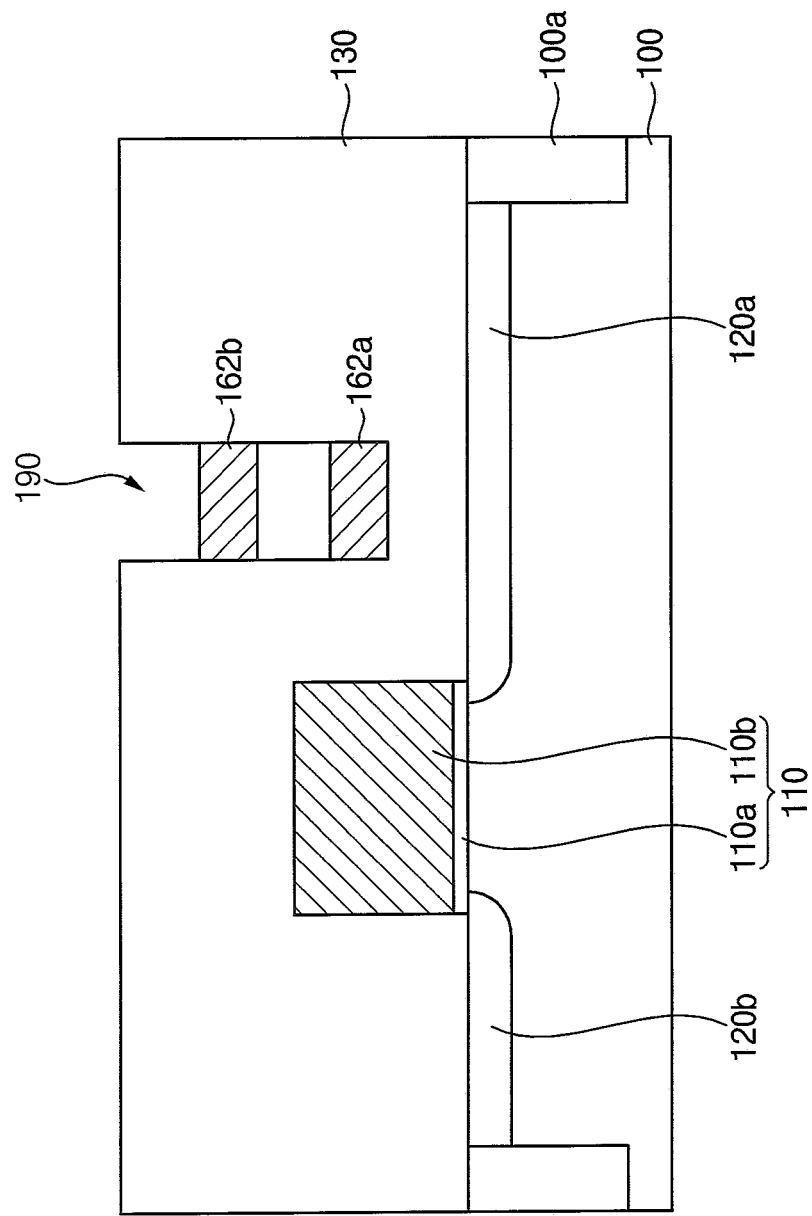

Referring to FIG. 22, an insulation layer may be formed to fill the trench 190, and the insulation layer may be etched to form an insulation pattern on the first threshold voltage controlling line 162a. For example, the insulation pattern may include the same material as that of insulation interlayer 130. When the insulation pattern includes the same material as the insulating interlayer 130, the insulation pattern may be merged with the insulating interlayer.

A conductive layer may be formed on the insulation pattern to fill the trench 190. Thereafter, the conductive layer may be etched back to form a second threshold voltage controlling line 162b in the trench 190.

Figure 23:
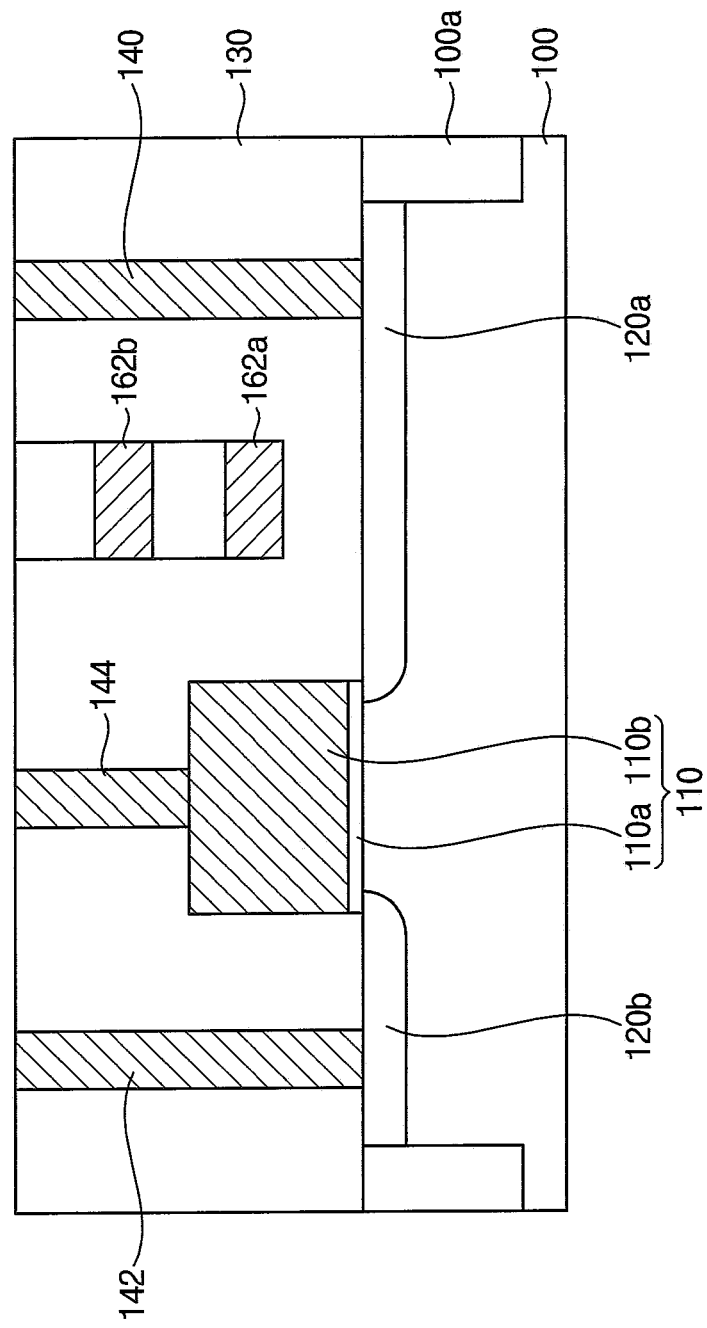

Referring to FIG. 23, an insulation layer may be formed to fill the trench 190, and the insulation layer may be etched back to form an insulation pattern on the second threshold voltage controlling line 162b. For example, the insulation pattern may include the same material as that of insulation interlayer 130. When the insulation pattern includes the same material as the insulating interlayer 130, the insulation pattern may be merged with the insulating interlayer.

Portions of the insulating interlayer 130 may be etched to form a first contact hole, a second contact hole, and a third contact hole. The first contact hole exposes the first impurity region 120a, and the second contact hole exposes the second impurity region 120b. The third contact hole exposes an upper surface of the gate electrode 110b.

Thereafter, a conductive material may be formed to fill the first to third contact holes. The conductive material may be planarized until the upper surface of the insulating interlayer 130 may be exposed to form the first to third contact plugs 140, 142, and 144.

Figure 24:
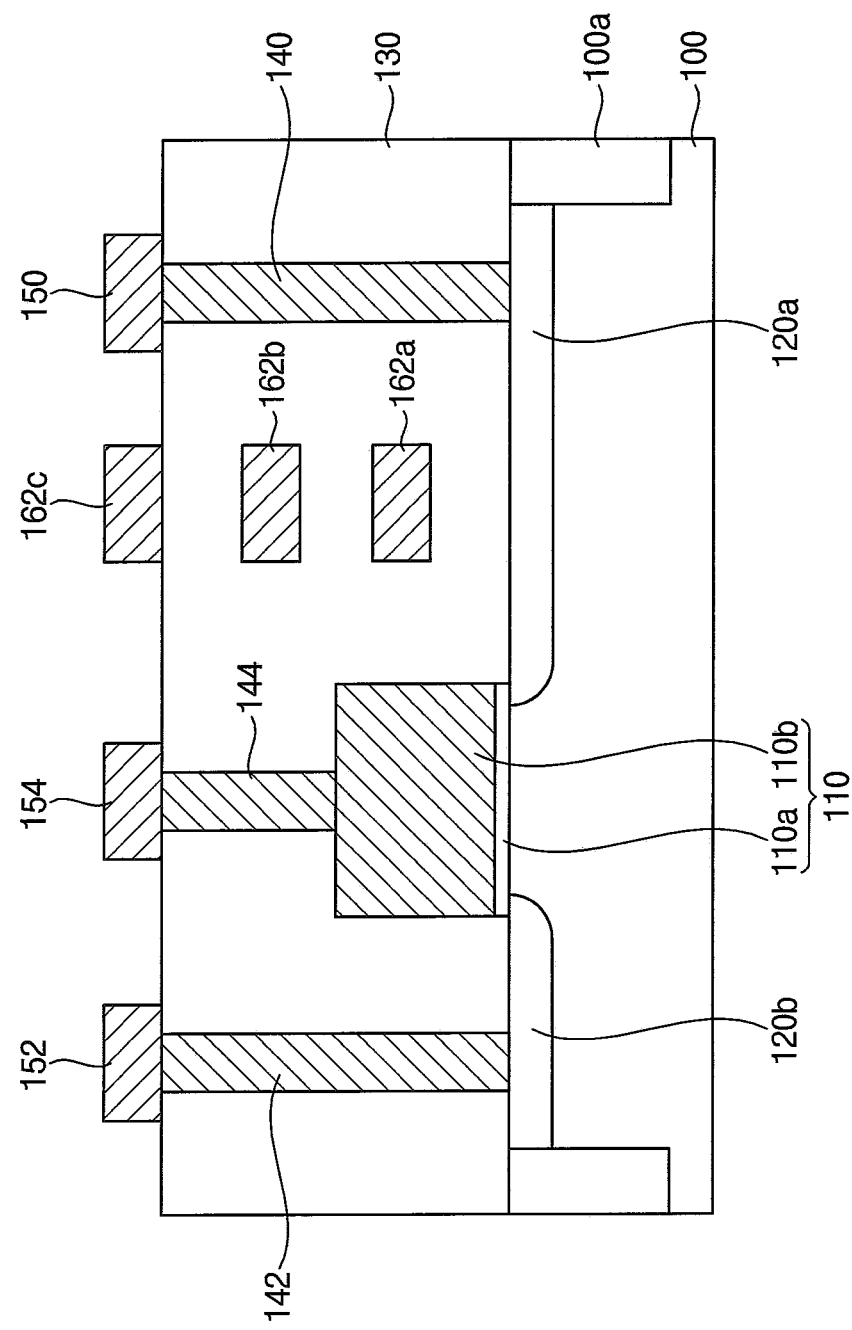

Referring to FIG. 24, a first conductive line 150, a second conductive line 152, a third conductive line 154 and the third threshold voltage controlling line 162c may be formed on the first to third contact plugs 140, 142 and 144 and the insulating interlayer 130.

In an example embodiment of the present inventive concept, a conductive layer may be formed on the first to third contact plugs 140, 142, and 144 and the insulating interlayer 130, and the conductive layer may be patterned to form the first conductive line 150, the second conductive line 152, the third conductive line 154, and the third threshold voltage controlling line 162c.

In an example embodiment of the present inventive concept, an additional insulating interlayer may be formed on the first to third contact plugs 140, 142, and 144 and the insulating interlayer 130. The additional insulating interlayer may be etched to form trenches. Conductive patterns may be formed to fill the trenches, so that the first conductive line 150, the second conductive line 152, the third conductive line 154, and the third threshold voltage controlling line 162c may be formed in the trenches, respectively.

As the above processes are performed, the transistor capable of controlling a threshold voltage may be manufactured.

While the present inventive concept has been described with reference to example embodiments thereof, it will be understood by those of ordinary skill in the art that various changes in form and details may be made thereto without departing from the spirit and scope of the present inventive concept.

What is claimed is:

1. A transistor, comprising:
   a gate structure disposed on a substrate, and including a gate insulation layer and a gate electrode, wherein and the gate structure extends in a first direction;
   a first impurity region disposed at an upper portion of a substrate and adjacent to a first sidewall of the gate structure;
   a second impurity region disposed at an upper portion of the substrate and adjacent to a second sidewall opposite to the first sidewall of the gate structure;
   a first threshold voltage controlling line spaced apart from the substrate, wherein the first threshold voltage controlling line faces at least a portion of the first impurity region, wherein the first threshold voltage controlling line includes a conductive material, and wherein the first threshold voltage controlling line extends in the first direction;
   a first contact plug disposed on the first impurity region;
   a first conductive line disposed on the first contact plug, wherein an upper surface of the first conductive line and an upper surface of the first threshold voltage controlling line are coplanar;
   a second contact plug disposed on the second impurity region;
   a second conductive line disposed on the second contact plug;
   a third contact plug disposed on the gate electrode; and
   a third conductive line disposed on the third contact plug.

2. The transistor of claim 1, wherein a first distance between the first contact plug and the gate structure is greater than a second distance between the second contact plug and the gate structure.

3. The transistor of claim 1, wherein the first threshold voltage controlling line is disposed between the gate structure and the first contact plug.

4. The transistor of claim 1, wherein the first threshold voltage controlling line includes metal or polysilicon.

5. The transistor of claim 1, wherein the first threshold voltage controlling line is of a plurality of threshold voltage controlling lines, and the plurality of threshold voltage controlling lines are positioned on the same plane as one another.

6. The transistor of claim 1, further comprising at least one third threshold voltage controlling line under the first threshold voltage controlling line, wherein the first threshold voltage controlling line and the at least one third threshold voltage controlling line are positioned at different heights from one another in a vertical direction with respect to a first surface of the substrate.

7. The transistor of claim 1, further comprising:
   a second threshold voltage controlling line spaced apart from the substrate, wherein the second threshold voltage controlling line faces at least a portion of the second impurity region, wherein the second threshold voltage controlling line includes a conductive material, and wherein the second threshold voltage controlling line extends in the first direction.

8. The transistor of claim 1, further comprising a charge trap spacer configured to store charges and disposed on a sidewall of the gate structure.

9. The transistor of claim 8, wherein the charge trap spacer includes silicon nitride.

10. The transistor of claim 1, wherein an upper surface of the third conductive line is coplanar with the upper surface of the first conductive line and the upper surface of the first threshold voltage controlling line.

11. A semiconductor device, comprising:
    a substrate including an active region and an isolation region;

a gate structure disposed on the substrate, and including a gate insulation layer and a gate electrode, wherein the gate structure extends across the active region;

a first impurity region disposed at an upper portion of the active region and adjacent to a first sidewall of the gate structure;

a second impurity region disposed at an upper portion of the active region and adjacent to a second sidewall opposite to the first sidewall of the gate structure;

a first contact plug contacting the first impurity region;

a first conductive line contacting the first contact plug;

a second contact plug contacting the second impurity region;

a second conductive line contacting the second contact plug;

a third contact plug contacting the gate electrode;

a third conductive line contacting the third contact plug; and a first threshold voltage controlling line spaced apart from the substrate, wherein the first threshold voltage controlling line faces at least a portion of the first impurity region, wherein the first threshold voltage controlling line includes a conductive material, wherein an upper surface of the first conductive line and an upper surface of the first threshold voltage controlling line are coplanar, and wherein a depletion region is generated at the first impurity region, when a voltage is applied to the first threshold voltage controlling line.

12. The semiconductor device of claim 11, wherein the first threshold voltage controlling line extends in a same direction as an extension direction of the gate structure, and the first threshold voltage controlling line extends to cross a direction in which the first impurity region extends.

13. The semiconductor device of claim 11, wherein the first threshold voltage controlling line is disposed between the gate structure and the first contact plug.

14. The semiconductor device of claim 11, wherein the first threshold voltage controlling line includes metal or polysilicon.

15. The semiconductor device of claim 11, wherein the first threshold voltage controlling line is of a plurality of threshold voltage controlling lines, and the plurality of threshold voltage controlling lines are positioned on the same plane as one another.

16. The semiconductor device of claim 11, further comprising at least one third threshold voltage controlling line under the first threshold voltage controlling line, wherein the first threshold voltage controlling line and the at least one third threshold voltage controlling line are positioned at different heights from one another in a vertical direction with respect to a first surface of the substrate.

17. The semiconductor device of claim 11, further comprising:

a second threshold voltage controlling line spaced apart from the substrate, wherein the second threshold voltage controlling line faces at least a portion of the second impurity region, wherein the second threshold voltage controlling line includes a conductive material, and wherein the second threshold voltage controlling line extends in a same direction as an extension direction of the gate structure.

18. A semiconductor device, comprising:

a substrate including an active region and an isolation region;

a gate structure disposed on the substrate, and including a gate insulation layer and a gate electrode, wherein the gate structure extends in a first direction to across the active region;

a charge trap spacer configured to store charges and disposed on a first sidewall of the gate structure;

a first impurity region disposed adjacent to the first sidewall of the gate structure;

a second impurity region disposed adjacent to a second sidewall opposite to the first sidewall of the gate structure; and a first threshold voltage controlling line spaced apart from each of the substrate and the charge trap spacer, wherein the first threshold voltage controlling line faces at least a portion of the first impurity region, wherein the first threshold voltage controlling line includes a conductive material, and wherein the first threshold voltage controlling line extends in the first direction, wherein charges are trapped or detrapped at the charge trap spacer, when a voltage is applied to the first threshold voltage controlling line, wherein the first impurity region is disposed between the first threshold voltage controlling line and the charge trap space, in a plan view.

19. The semiconductor device of claim 18, wherein the charge trap spacer includes silicon nitride.

20. The semiconductor device of claim 18, wherein the gate structure, the charge trap spacer, the first and second impurity regions constitute a cell structure, and a plurality of the cell structures are provided in the semiconductor device, wherein the semiconductor device further comprises:

a first conductive line electrically connected to the plurality of first impurity regions of the plurality of cell structures;

a second conductive line electrically connected to the plurality of second impurity regions of the plurality of cell structures; and a third conductive line electrically connected to the plurality of gate structures of the plurality of cell structures, wherein the first conductive line extends in a direction that is substantially perpendicular to a direction in which the third conductive line extends.

* * * * *